US012790544B2

(12) United States Patent
Nakanishi et al.

(10) Patent No.: US 12,790,544 B2
(45) Date of Patent: Nov. 10, 2026

(54) PHOSPHOR, METHOD FOR PRODUCING SAME, LIGHT EMITTING ELEMENT AND LIGHT EMITTING DEVICE

(71) Applicant: National Institute for Materials Science, Tsukuba (JP)

(72) Inventors: Takayuki Nakanishi, Tsukuba (JP); Naoto Hirosaki, Tsukuba (JP); Takashi Takeda, Tsukuba (JP); Shiro Funahashi, Tsukuba (JP)

(73) Assignee: National Institute for Materials Science, Tsukuba (JP)

( * ) Notice: Subject to any disclaimer, the term of this patent is extended or adjusted under 35 U.S.C. 154(b) by 482 days.

(21) Appl. No.: 18/290,264

(22) PCT Filed: Mar. 30, 2022

(86) PCT No.: PCT/JP2022/016324

§ 371 (c)(1),
(2) Date: Nov. 10, 2023

(87) PCT Pub. No.: WO2022/244523

PCT Pub. Date: Nov. 24, 2022

(65) Prior Publication Data

US 2024/0240081 A1 Jul. 18, 2024

(30) Foreign Application Priority Data

May 21, 2021 (JP) ................................ 2021-086333

(51) Int. Cl.
*C09K 11/77* (2006.01)
*H10H 20/851* (2025.01)

(52) U.S. Cl.
CPC .. *C09K 11/77348* (2021.01); *C09K 11/77068* (2021.01); *C09K 11/77218* (2021.01); *C09K 11/77498* (2021.01); *H10H 20/8512* (2025.01); *H10H 20/8513* (2025.01); *C01P 2002/54* (2013.01); *C01P 2002/72* (2013.01); *C01P 2002/77* (2013.01); *C01P 2006/60* (2013.01)

(58) Field of Classification Search
CPC ........ C09K 11/77348; C09K 11/77218; C09K 11/77068; C09K 11/77496; H10H 20/8513; H10H 20/8512
See application file for complete search history.

(56) References Cited

U.S. PATENT DOCUMENTS

2006/0192178 A1 8/2006 Hirosaki
2006/0197439 A1* 9/2006 Sakane ............. C09K 11/0883 313/503
2007/0007494 A1 1/2007 Hirosaki et al.
2007/0018567 A1 1/2007 Hirosaki
2007/0108896 A1 5/2007 Hirosaki
2009/0129052 A1 5/2009 Hirosaki
2009/0153028 A1 6/2009 Hirosaki
2009/0236963 A1 9/2009 Nagatomi et al.
2009/0236969 A1 9/2009 Hirosaki
2011/0121234 A1 5/2011 Hirosaki
2013/0168606 A1 7/2013 Hirosaki et al.
2015/0014726 A1* 1/2015 Usui ................ C09K 11/77348 252/301.4 F
2015/0275082 A1 10/2015 Hirosaki et al.
2016/0060518 A1 3/2016 Hirosaki et al.
2017/0283261 A1 10/2017 Hirosaki et al.
2019/0127638 A1 5/2019 Hirosaki et al.

FOREIGN PATENT DOCUMENTS

JP A 2005-112922 4/2005
JP B 3668770 4/2005
JP B 3837551 8/2006
JP B 3837588 8/2006
JP B 3921545 3/2007
JP A 2009-167328 7/2009
JP B 4524368 6/2010
JP A 2014-031496 2/2014
WO WO2005-019376 A1 3/2005
WO WO2005-033247 A1 4/2005
WO WO2005-052087 6/2005
WO WO2005-087896 A1 9/2005
WO WO2006-093298 9/2006
WO WO2006-101096 A1 9/2006
WO WO2007-066733 A1 3/2007
WO WO2013-137434 A1 9/2013
WO WO2014-175385 A1 10/2014

OTHER PUBLICATIONS

Chyn-Yun Wang et al., New Deep-Blue-Emitting Ce-Doped A4-mBnC19+2mX29+m (A=Sr, La; B=Li; C=Si, Al; X=O, N; 0 ≤ m ≤ 1; 0 ≤ n ≤ 1) Phosphors for High-Color-Rendering Warm White Light-Emitting Diodes, ACS Appl. Mater. Interfaces, vol. 11, 2019, pp. 29047-29055.

* cited by examiner

*Primary Examiner* — C Melissa Koslow
(74) *Attorney, Agent, or Firm* — Trojan Law Offices, P.C.

(57) ABSTRACT

Provided are a phosphor emitting light having a wavelength of 600 nm or more in the red-to-nearinfrared range when irradiated with visible light or ultraviolet light; a method for producing same; a light emitting element using same; and a light emitting device using same. The phosphor includes an inorganic compound including A element, M element, D element, E element (A is at least one element selected from the group of Mg, Ca, Sr and Ba; M is at least one element selected from the group of Mn, Eu, Ce, Nd, Tb, Dy, Ho, Er, Tm and Yb; D is Si and/or Al; and E is O and/or N) and, if necessary, G element (G is Li), and represented by $(A, M)_a D_d E_e G_g$, (atomic fraction parameters a, d, e and g satisfy $2.4 \leq a \leq 4.8$, $17.4 \leq d \leq 22.2$, $26.2 \leq e \leq 28.6$ and $0 \leq g \leq 3$).

19 Claims, 4 Drawing Sheets

PHOSPHOR, METHOD FOR PRODUCING SAME, LIGHT EMITTING ELEMENT AND LIGHT EMITTING DEVICE

TECHNICAL FIELD

With respect to the present invention, the present disclosure relates to a phosphor including an inorganic compound including as a host crystal a crystal being represented by $Sr_{6x}(Si, Al)_{27-12x}(O, N)_{31-6x}Li_{3y}$, where $0.4 \leq x \leq 0.8$ and $0 \leq y \leq 0.35$, (hereinafter, referred to as "present crystal") or having a crystal structure identical to that of $Sr_3Si_{12.432}Al_{8.568}O_{1.608}N_{26.392}Li_{0.96}$ (hereinafter, referred to as "present identical crystal"), a method of manufacturing the same, and an application thereof.

BACKGROUND ART

The phosphor is utilized in a fluorescent display tube (VFD: Vacuum-Fluorescent Display), a field emission display (FED: Field Emission Display or SED: Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source as mentioned above, the luminance of the phosphor tends to decrease and a phosphor having little degradation in the brightness is demanded. Therefore, a phosphor having an inorganic crystal containing nitrogen in a crystal structure thereof as a host crystal, instead a phosphor such as a silicate phosphor, a phosphate phosphor, an aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), calcium oxide (CaO), and europium oxide ($Eu_2O_3$) are mixed in predetermined molar ratios and the resultant mixture is fired by a hot press method in one atmospheric pressure (0.1 MPa) of nitrogen atmosphere at 1700 °C for one hour (for example, refer to Patent Reference 1). It was reported that α-sialon activated with an Eu ion ($Eu^{2+}$) manufactured by the above processes had become a phosphor emitting yellow light in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (for example, refer to Patent References 2 and 3).

As another example of the sialon phosphor, a green phosphor in which R type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when activated by $Ce^{3+}$ (for example, refer to Patent Reference 6).

As an example of an oxynitride phosphor, a blue phosphor having a JEM phase ($LaAl(Si_{6-z}Al_z)Ni_{10-z}O_z$) as a host crystal, which is activated by Ce (refer to Patent Reference 7), is known. It is known that, in the phosphor, an emission wavelength thereof may shift to a longer wavelength as well as an excitation wavelength thereof may shift to a longer wavelength by substituting part of La with Ca while the crystal structure remains the same.

As another example of the oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9) Color rendering properties of a white LED are improved by utilizing this phosphor. A phosphor to which Ce was added as the activating element was reported to be an orange phosphor.

Thus, an emission color of the phosphor is determined by a combination of the crystal to act as the host crystal and a metal ion (activating ion) being incorporated into the crystal as a solid solution. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the aforementioned, it is important to find a host crystal having a new crystal structure in developing a new phosphor and it is possible to produce a new phosphor having new emission characteristics by activating such a host crystal with a metal ion causing the host crystal to exhibit luminescence characteristics. Further, it is also possible to produce a crystal having another chemical composition by changing the constituent element while a crystal structure thereof is maintained, thereby producing a phosphor having new emission characteristics.

PRIOR ART REFERENCE

Patent Reference

[Patent Reference 1] Japanese Patent No. 3668770, Specification.
[Patent Reference 2] Japanese Patent No. 3837551, Specification.
[Patent Reference 3] Japanese Patent No. 4524368, Specification.
[Patent Reference 4] Japanese Patent No. 3921545, Specification.
[Patent Reference 5] International Publication No. WO2007/066733.
[Patent Reference 6] International Publication No. WO2006/101096.
[Patent Reference 7] International Publication No. WO2005/019376.
[Patent Reference 8] Japanese Patent Application Publication No. 2005-112922.
[Patent Reference 9] Japanese Patent No. 3837588, Specification.

SUMMARY OF THE INVENTION

Problem to be Solved by the Invention

In an embodiment of the present invention, a new phosphor having certain emission characteristics is provided. It is expected that the new phosphor may have different emission characteristics (an emission color and excitation characteristics, and an emission spectrum). It may have emission in the red and near-infrared regions ranging from 600 nm or more, especially when irradiated with visible light or ultraviolet ray. And an inorganic phosphor having high emission intensity may be provided when combined with a LED of 600 nm or less. A light emitting element and a light emitting device with high durability utilizing such a phosphor can be provided.

Means to Solve the Problem

The present inventors, under such a circumstance, have investigated in detail a phosphor having, as a host crystal, a new crystal containing nitrogen and a crystal having a crystal structure thereof in which a metal element or nitrogen element is substituted with another element and found out that an inorganic material having the present crystal and the present identical crystal as a host or a host crystal emits fluorescence of high intensity. It has been also found out that the phosphor exhibits near-infrared or red color emission with a specific chemical composition.

And it has been found that a light emitting element characterized by a component of light in a red or infrared region, a white color light-emitting diode using the same, and a light emitting device such as an illuminating device can be obtained by employing the phosphor.

The present inventors conducted an intensive investigation in consideration of the above-mentioned background so as to successfully provide a phosphor which may render emission with a high intensity of a specific wavelength region by implementing configurations as described below. Further, a phosphor having excellent emission characteristics was successfully manufactured by employing a method as described below. Further, there were successfully provided a light-emitting element and a light emitting device which have excellent features by implementing configurations in utilizing the phosphor as described below. It will be described in more detail below.

In an embodiment of the present invention, a phosphor may include an inorganic compound represented by $(A, M)_aD_dE_eG_g$ that includes at least an A element, an M element, a D element, an E element (here, A is at least one kind or two or more kinds of elements selected from the group consisting of Mg, Ca, Sr, and Ba; M is at least one kind or two or more kinds of elements selected from the group consisting of Mn, Eu, Ce, Nd, Tb, Dy, Ho, Er, Tm, and Yb; D is one kind or two or more kinds of elements selected from the group consisting of Si and Al; and E is at least one kind or two or more kinds of elements selected from the group consisting of O and N); and, if necessary, a G element (here, G is Li element) wherein atomic fraction parameters: a, d, e, and g satisfy:

$$2.4 \le a \le 4.8,$$

$$17.4 \le d \le 22.2,$$

$$26.2 \le e \le 28.6, \text{ and}$$

$$0 \le g \le 3.$$

The above issues are resolved.

The above-mentioned parameters g may be a numeral value in the following range:

$$0.21 \le g \le 1.05.$$

The above-mentioned inorganic compound may be represented by the composition of $(A, M)_{6x}D_{27-12x}E_{31-6x}G_{3y}$ (here, x and y satisfy: $0.4 \le x \le 0.8$ and $0 \le y \le 0.35$, respectively).

Here, "$(A, M)_{6x}$" may mean that both A atom and M atom exist together (that is, each subscript numeral value is larger than zero (0) for each atom) and the total numeral value is "6x" where the number of A atoms and the number of M atoms are summed. For example, if parameters p and q are made to be p+q=6x, the above-mentioned formula also may be "$(A_pM_q)D_{27-12x}E_{31-6x}G_{3y}$ (here, p+q=6x, p>0, and q>0)".

The above-mentioned x satisfies $0.45 \le x \le 0.55$.

The above-mentioned inorganic compound may include a crystal represented by $(A, M)_{6x}D_{27-12x}E_{31-6x}G_{3y}$ (here, $0.4 \le x \le 0.8$ and $0 \le y \le 0.35$) (hereinafter, referred to as present crystal).

And it may be a crystal having the identical crystal structure to that of the present crystal (hereinafter, referred to as present identical crystal).

The above-mentioned inorganic compound may include a crystal represented by $(Sr, Eu)_3(Si, Al)_{21}(O, N)_{28}Li_{0.96}$.

The inorganic compound may include a crystal having the identical crystal structure to that of $Sr_3Si_{12.432}Al_{8.568}O_{1.608}N_{26.392}Li_{0.96}$.

The present crystal and the present identical crystal may be in the hexagonal crystal system and the lattice constants: a, b, and c may satisfy:

$$1.6 < a < 1.8 \text{ nm},$$

$$b = a, \text{ and}$$

$$0.44 < c < 0.52 \text{ nm}.$$

The present crystal and the present identical crystal may be a crystal or crystals that belong to the space group of $P6_3$ (the 173th space group of the International Tables for Crystallography).

The above-mentioned inorganic compound may include a crystal represented by $Sr_{6x}(Si, Al)_{27-12x}(O, N)_{31-6x}Li_{3y}$(here, 0.4≤x≤0.8 and 0≤y≤0.35) or a crystal having the identical crystal structure to that of the above-mentioned crystal and further may include an M element.

The A element may be Sr, the M element may be Eu, and the E element is one kind or two or more kinds of element selected from the group consisting of O and N.

The D element may include Si and Al and the following may be satisfied:

$$0.4 \leq Al/(Al+Si) \leq 0.6.$$

The E element may include O and N and the following may be satisfied:

$$0.01 \leq O/(O+N) \leq 0.1.$$

Any one of the above-mentioned phosphors may emit light having an emission peak at a wavelength that is 600 nm or longer and 850 nm or shorter upon irradiation of light having a wavelength that is 300 nm or longer and 600 nm or shorter.

In an embodiment of the present invention, a method of manufacturing any of the above-mentioned phosphor may include steps of: blending one or more raw materials selected from the group consisting of nitride, oxynitride, oxide, carbonate, and fluoride, each of which comprises an A element (here, A is at least one kind or two or more kinds of elements selected from the group consisting of Mg, Ca, Sr, and Ba), an M element (here, M is at least one kind or two or more kinds of elements selected from the group consisting of Mn, Eu, Ce, Nd, Tb, Dy, Ho, Er, Tm, and Yb), a D element (here, D is one kind or two or more kinds of elements selected from the group consisting of Si and Al) and, if necessary, a G element (here, G is Li element); and firing it at a temperature that is 1400 °C or higher and is 2200 °C or lower. The above-mentioned issue is resolved.

A light emitting element including an excitation source that emits light having a wavelength in a range that is 300 nm or longer and 600 nm or shorter and any one of the above-mentioned phosphors may be provided. The above issues are resolved.

The above-mentioned excitation source may be a light-emitting diode (LED) or a laser diode (LD).

Any one of the above-mentioned light emitting elements may include one or more phosphors which emit fluorescence light having a maximum value of an emission peak in a wavelength range that is 400 nm or longer and 760 nm or shorter upon irradiation of light having a wavelength that is 300 nm or longer and 600 nm or shorter.

Any one of the above-mentioned light emitting elements may include one or two or more kinds of phosphors selected from the group consisting of: AlN:(Eu, Si), $BaMgAl_{10}O_{17}$:Eu, $SrSi_9Al_{19}ON_{31}$:Eu, $LaSi_9Al_{19}N_{32}$:Eu, α-sialon:Ce, JEM:Ce, β-sialon:Eu, $(Ba, Sr, Ca, Mg)_2SiO_4$:Eu, $(Ca, Sr, Ba)Si_2O_2N_2$:Eu, YAG:Ce, α-sialon:Eu, $CaAlSiN_3$:Ce, $La_3Si_6N_{11}$:Ce, $CaAlSiN_3$:Eu, $(Ca, Sr)AlSiN_3$:Eu, $Ca_2Si_5N_8$:Eu, and $Sr_2Si_5N_8$:Eu.

In an embodiment of the present invention, a light emitting device may include any one of the above-mentioned light emitting elements, and may be any one of an illuminating device, a backlight for a liquid crystal panel, a lamp for a projector, an infrared lighting device, and a light source for an infrared measuring device. The above-mentioned issue is resolved.

Effect of the Invention

In an embodiment of the present invention, a phosphor may include a $Sr_{6x}(Si, Al)_{27-12x}(O, N)_{31-6x}Li_{3y}$ crystal or a crystal having the identical crystal structure to that of a $Sr_3Si_{12.432}Al_{8.568}O_{1.608}N_{26.392}Li_{0.96}$ crystal as a main component. The phosphor may exhibit emission that has intensity higher than that of a conventional oxide phosphor or a conventional oxynitride phosphor. It may be excellent as an infrared or near-infrared phosphor with a specific chemical composition. With respect to this phosphor, it is not likely that the emission intensity would be reduced even if exposed to the excitation source. A useful phosphor to be used suitably in a light emitting element such as a white color emitting diode, an illuminating device using the same, a backlight source for a liquid crystal, an infrared lighting device, a light emitting device such as an infrared light source for inspection can be provided.

EMBODIMENT FOR CARRYING OUT THE INVENTION

Figure 1:
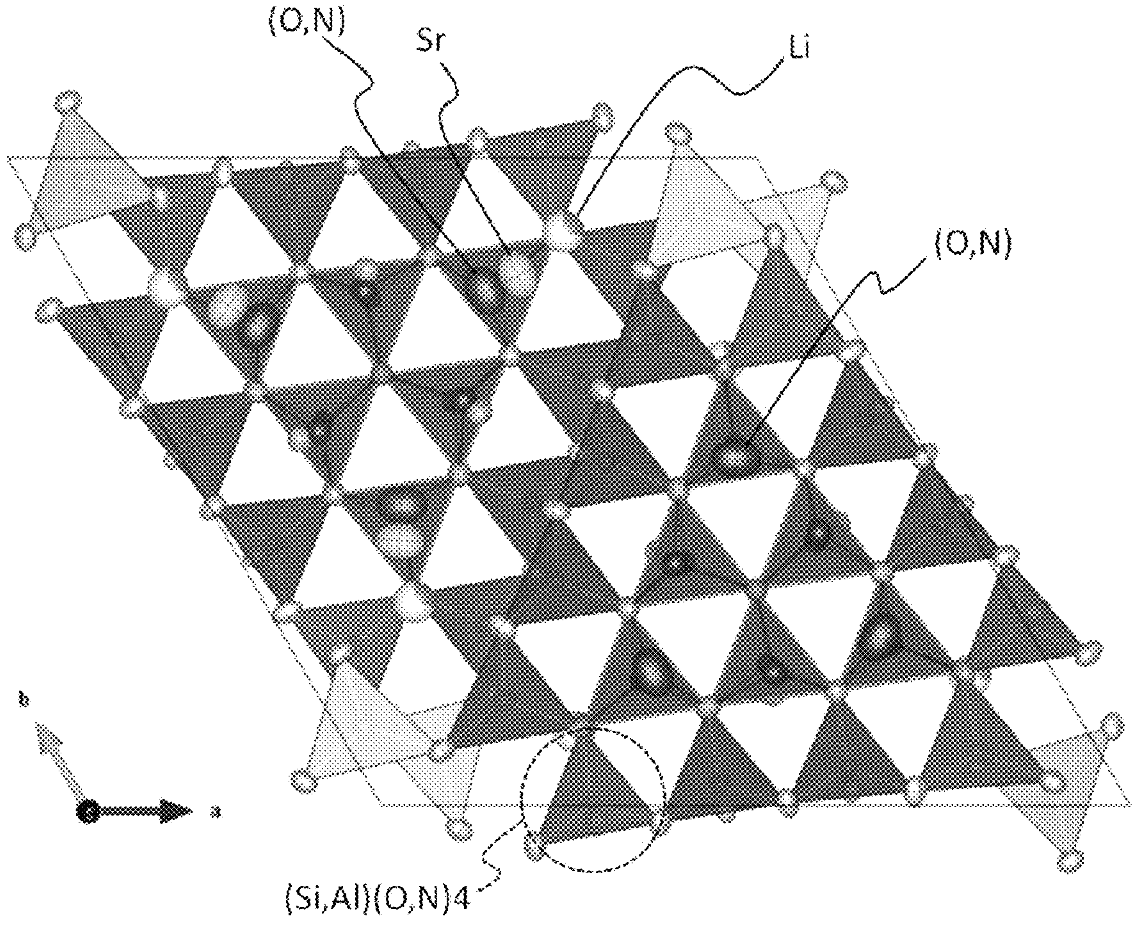
FIG. 1 shows a diagram illustrating a crystal structure of $Sr_3Si_{12.432}Al_{8.568}O_{1.608}N_{26.392}Li_{0.96}$ crystal.

Hereafter, a phosphor of present invention is described in detail.

In an embodiment of the present invention, a phosphor may include an inorganic compound represented by $(A, M)_aD_dE_eG_g$ that includes at least an A element, an M element, a D element, an E element (here, A is at least one kind or two or more kinds of elements selected from the group consisting of Mg (magnesium), Ca (calcium), Sr (strontium), and Ba (barium); M is at least one kind or two or more kinds of elements selected from the group consisting of Mn (manganese), Eu (europium), Ce (cerium), Nd (neodymium), Tb (terbium), Dy (dysprosium), Ho (holmium), Er (erbium), Tm (thulium), and Yb (ytterbium); D is one kind or two or more kinds of elements selected from the group consisting of Si (silicon) and Al (aluminum); and E is at least one kind or two or more kinds of elements selected from the group consisting of O (oxygen) and N (nitrogen);

and, if necessary, a G element (here, G is Li (lithium) element) wherein atomic fraction parameters: a, d, e, and g satisfy:

$$2.4 \leq a \leq 4.8,$$

$$17.4 \leq d \leq 22.2,$$

$$26.2 \leq e \leq 28.6, \text{ and}$$

$$0 \leq g \leq 3.$$

It may serve as a phosphor to emit light in red and near-infrared regions ranging from 600 nm or more when irradiated with light having a wavelength of 600 nm or less. When the values of the parameters are out of the range, the emission intensity might be lowered. Here, as the A element, an element selected from the group consisting of Y (yttrium), Lu (lutetium), and La (lanthanum) may be included.

It may further include the G element (G is Li element) and the value of the parameter may satisfy the following range: $0.21 \leq g \leq 1.05$. In particular, it is preferable since the emission intensity may be increased.

In an embodiment of the present invention, a phosphor may include an inorganic compound having a composition represented by $(A, M)_{6x}D_{27-12x}E_{31-6x}G_{3y}$ (here, $0.4 \leq x \leq 0.8$ and $0 \leq y \leq 0.35$). The emission intensity may become higher as the crystal may be easily formed. Further, the composition range may be $0.45 \leq x \leq 0.55$. It may be preferable since crystallization may become easier. The most stable crystal may be obtained when x=5.

The inorganic compound may include a crystal represented by $(A, M)_{6x}D_{27-12x}E_{31-6x}G_{3y}$ (here, $0.4 \leq x \leq 0.8$ and $0 \leq y \leq 0.35$) (hereinafter, referred to present crystal). And, the inorganic compound may include a crystal having the identical crystal structure to that of the $(A, M)_{6x}D_{27-12x}E_{31-6x}G_{3y}$ crystal (hereinafter, referred to as present identical crystal). The phosphor has high emission intensity. As the present identical crystal, it may be a crystal having the identical crystal structure to that of the $Sr_3Si_{12.432}Al_{8.568}O_{1.608}N_{26.392}Li_{0.96}$ crystal.

The crystal having the identical crystal structure may mean to be, as compared to the original crystal, a crystal in which coordinates of positions of atoms existing in the crystal lattice and corresponding to those in the original crystal are the same as or close to those of the original crystal and the kinds of the corresponding atoms are partially or totally different. For example, as the crystal having the identical crystal structure to that of the $Sr_3Si_{12.432}Al_{8.568}O_{1.608}N_{26.392}Li_{0.96}$ crystal and being represented by $(A, M)_{6x}D_{27-12x}E_{31-6x}G_{3y}$ (original crystal), a crystal in which part of Sr (atom to be corresponded to) of the original crystal is replaced with Ba and Eu; part of Si (atom to be corresponded to) of the original crystal is replaced with Al; and part of N (atom to be corresponded to) is replaced with O can be cited.

Further, as a crystal having the identical crystal structure to that of the $Sr_3Si_{12.432}Al_{8.568}O_{1.608}N_{26.392}Li_{0.96}$ crystal, a $(A, M)_{6x}D_{27-12x}E_{31-6x}G_{3y}$ crystal; a $A_{6x}D_{27-12x}E_{31-6x}G_{3y}$ crystal; a $(Sr, Eu)_3(Si, Al)_{21}(O, N)_{28}Li_{0.96}$ crystal; and a $Sr_3Si_{12.432}Al_{8.568}O_{1.608}N_{26.392}Li_{0.96}$ crystal may be cited. It was confirmed that these crystals were what the present inventors had synthesized newly and has been found out to be new crystals. As far as the present inventors know, they are crystals having never been reported before the present application.

As a result of the single crystal structure analysis of the $Sr_3Si_{12.432}Al_{8.568}O_{1.608}N_{26.392}Li_{0.96}$ the present inventors synthesized, it has been found that the present crystal belongs to the hexagonal crystal system and belongs to the $P6_3$ space group (the 173th space group of the International Tables for Crystallography) and has the crystal structure parameters and atomic coordinate positions as shown in Table 1. In Table 1, lattice constants a, b, and c signify respective lengths of the axes of the unit cell, and α, β, and γ signify respective angles between axes of the unit cell. The atomic coordinates indicate a position of each atom in the unit cell in terms of a value from 0 to 1 using the unit cell as a unit. The analysis results showing that there were atoms of Sr, Si, Al, Li, O, and N, respectively and Sr existed in two (2) kinds of sites: (A1 to A2) was obtained. Also, according to the analysis results thus obtained, Si and Al existed in nine (9) kinds of sites: (B1 to B9) without any distinctions in the kind. Further, according to the analysis results thus obtained, N and O existed in eleven (11) kinds of sites: (X1 to X11) without any distinctions in the kind.

TABLE 1

Crystal structure parameters (atomic coordinates) of $Sr_3Si_{12.432}Al_{8.568}O_{1.608}N_{26.392}Li_{0.96}$ crystal

| | | |
|---|---|---|
| Crystal system | | Hexagonal structure |
| Space group | | $P6_3$ |
| Space group number | | 173 |
| Lattice constant | a | 1.167416(11) nm |
| | b | 1.167416(11) nm |
| | c | 0.48775(4) nm |
| | α | 90 degrees |
| | β | 90 degrees |
| | γ | 120 degrees |

| Atom | Site occupancy rate | Atomic coordinates x | y | z |
|---|---|---|---|---|
| A01 | 0.5 | 0.40848(4) | 0.22804(4) | 0.00384(16) |
| A02 | 0.5 | 0.56566(3) | 0.17317(3) | 0.01491(16) |
| B01 | 1 | 0.00255(3) | 0.28191(3) | 0.02402(18) |
| B02 | 1 | 0.16194(4) | 0.24446(4) | 0.0269(2) |
| B03 | 1 | 0.34784(3) | 0.40462(3) | 0.0222(2) |
| B04 | 1 | 0.12247(4) | 0.03804(4) | 0.0200(2) |
| B05 | 1 | 0.03255(3) | 0.46756(4) | 0.0227(2) |
| B06 | 0.5 | 0.44297(11) | 0.24934(11) | 0.3506(4) |
| B07 | 0.5 | 0.19507(12) | 0.44532(12) | 0.1518(4) |
| B08 | 0.5 | 0.59227(11) | 0.21705(11) | 0.3466(4) |
| B09 | 0.5 | 0.21805(11) | 0.62529(12) | 0.1641(4) |
| C01 | 0.32 | 0.3147(8) | 0.2002(8) | 0.002(4) |
| X01 | 1 | 0.15187(11) | 0.51213(11) | 0.0099(8) |
| X02 | 1 | 0.30431(11) | 0.48099(11) | 0.0048(7) |
| X03 | 1 | 0.32690(14) | 0.20641(13) | 0.4874(8) |
| X04 | 1 | 0.12264(14) | 0.03744(13) | 0.4063(4) |
| X05 | 1 | 0.46029(13) | 0.00415(14) | 0.3655(4) |
| X06 | 1 | 0.333333 | 0.666667 | 0.000(3) |
| X07 | 1 | 0.17328(13) | 0.23546(14) | 0.3936(4) |
| X08 | 1 | 0.35908(13) | 0.38494(13) | 0.3700(4) |
| X09 | 1 | 0.29866(14) | 0.02252(13) | 0.3716(4) |
| X10 | 0.5 | 0.4642(4) | 0.2591(4) | 0.0058(13) |
| X11 | 0.5 | 0.5774(2) | 0.2037(4) | 0.0041(13) |

A01 A02: Sr
B01~B09: Si,Al
C01: Li
X01~X11: O,N

FIG. 1 shows a diagram illustrating a crystal structure of $Sr_3Si_{12.432}Al_{8.568}O_{1.608}N_{26.392}Li_{0.96}$ crystal.

According to the analysis result using the data of Table 1, it has been found that the present crystal has a crystal structure as shown in FIG. 1 where Sr element and Li element are contained in the skeleton composed of a series of tetrahedrons constituted of bonds between (Si or Al) and (O or N). FIG. 1 shows that both Sr and (O, N) appear to coexist, but either exists in reality.

While synthesize crystals having various compositions were analyzed, it was confirmed that a crystal having the identical crystal structure to that of the $Sr_3Si_{12.432}Al_{8.568}O_{1.608}N_{26.392}Li_{0.96}$ crystal could have the identical crystal structure in a wide composition range and the general formula could be represented by $(A, M)_{6x}D_{27-12x}E_{31-6x}G_{3y}$. Here, the crystal can be configured wherein A comprises at least one kind or two or more kinds of elements selected from the group consisting of Mg, Ca, Sr, and Ba; M is at least one kind or two or more kinds of elements selected from the group consisting of Mn, Eu, Ce, Nd, Tb, Dy, Ho, Er, Tm, and Yb; D is one kind or two or more kinds of elements selected from the group consisting of Si and Al; E is at least one kind or two or more kinds of elements selected from the group consisting of O and N; and G is Li.

The composition varies by changing the parameters: x and y while the crystal structure is maintained. While x is a parameter which determines the amount of (A, M), the value of x satisfies: $0.4 \le x \le 0.8$. Here, it is desirable that the condition where the electrical neutrality of cations of A, D, and G and anions of E is maintained is satisfied. While y is a parameter which determines the amount of G, the value of y satisfies: $0 \le y \le 0.35$. In particular, the crystal tends to be stabilized when y is in the raged of $0.023 \le y \le 0.35$.

The crystal structure of the general formula of $(A, M)_{6x}D_{27-12x}E_{31-6x}G_{3y}$ is identical to that of the $Sr_3Si_{12.432}Al_{8.568}O_{1.608}N_{26.392}Li_{0.96}$ crystal and, in Table 1, the sites of A01 and A02 are occupied by the A element and the M element, the sites of B01 to B09 are occupied by the D element, the site of C01 is occupied by the G element, and the sites of X01 to X11 are occupied by the E element. The site occupancy rate and the lattice constants vary by changing the kind of elements and the composition, but the crystal structure and the atomic coordinates change little. Therefore, the generation of the $(A, M)_{6x}D_{27-12x}E_{31-6x}G_{3y}$ crystal can be determined using the information of Table 1.

A phosphor including an inorganic substance with which a light-emitting ion is activated wherein the present crystal or the present identical crystal is in the hexagonal system and the lattice constants: a, b, and c satisfy the following:

$$1.6 < a < 1.8 \text{ nm},$$

$$b = a, \text{ and}$$

$$0.44 < c < 0.52 \text{ nm}.$$

The phosphor, in which the present crystal or the present identical crystal has a crystal that belongs to the $P6_3$ space group (the 173th space group of International Tables for Crystallography) as a host, exhibits high emission intensity.

As one embodiment of the present invention, a phosphor may be included, which further includes an M element in a crystal represented by $Sr_{6x}(Si, Al)_{27-12x}(O, N)_{31-6x}Li_{3y}$ (here, $0.4 \le x \le 0.8$ and $0 \le y \le 0.35$) or a crystal having the identical crystal structure thereof.

The crystal structure of the crystal may be particularly table when the D element includes Si and Al where $0.4 \le Al/(Al+Si) \le 0.6$. The emission intensity is high.

The crystal structure of the crystal may be particularly table when the E element includes O and N where $0.01 \le O/(O+N) \le 0.1$. The emission intensity is high.

The crystal structure of the crystal may be particularly table when the G element is included where $0.15 \le y \le 0.3$. The emission intensity is high.

As one embodiment of the present invention, a phosphor may be included, which has a composition where M is Eu and the content amount m of Eu in $(A, M)_{6x}D_{27-12x}E_{31-6x}G_{3y}$ satisfies $0.001 \le m \le 0.1$. Here, the above-mentioned formula may also be represented by $A_{6x-m}M_mD_{27-12x}E_{31-6x}G_{3y}$. In such a case, these phosphors emit light having an emission peak of a maximum value in a range that is 600 nm or longer and 850 nm or shorter upon irradiation of light having any wavelength that is 300 nm or longer and 600 nm or shorter so as to be suitable for such an application of the phosphor.

The phosphor in which the inorganic compound includes a single crystal particle having a mean particle diameter of 0.1 μm or larger and 20 μm or smaller or an aggregate of single crystals may exhibit high emission efficiency. The operability may be good in the case where it is implemented in an LED. It may be good to control particle diameters in this range.

Impurity elements of Fe, Co, and Ni included in the inorganic substance may cause the emission intensity to decrease. The sum amount of these impurity elements in the phosphor may be 500 ppm or less. The influence of these elements on the emission intensity may be decreased.

As one of the embodiments of the present invention, there may be included a phosphor having at least 20 mass % of content amount of phosphor having the present crystal or the present identical crystal as the host crystal, which is comprised of a mixture of the phosphor having the present crystal or the present identical crystal as the host crystal and another crystal phase or an amorphous phase. In a single phosphor including an inorganic compound having the present crystal or the present identical crystal as the host crystal, the present embodiment may be applied in the case where the target property cannot be achieved or where electric conductivity is acquired additionally. The content amount of the phosphor may be adjusted such that the predetermined property may be acquired where the phosphor includes the inorganic compound having the present crystal or the present identical crystal as the host crystal. If it is 20 mass % or less, the emission intensity may be decreased.

In such an embodiment of the present invention, it is not necessary to stipulate the manufacturing method of the phosphor. For example, a raw material mixture may be fired in an inert atmosphere containing nitrogen in a temperature range that is 1400 °C or higher and 2200 °C or lower, wherein the raw material mixture, which is a mixture of metal compounds, may constitute a phosphor having the present crystal or the present identical crystal as the host by firing. In an embodiment of the present invention, the crystal that is included in the inorganic compound included by the phosphor may be in the hexagonal system and may belong to the space group of $P6_3$. Another crystal in a different crystal system therefrom or belonging to a different space group may be mixed therein depending on the synthesis condition such as a firing temperature. The emission characteristics of the phosphor may change only slightly such that the phosphor can be used as a high emission intensity phosphor.

As a starting material, one or more raw materials selected from the group consisting of nitride, oxynitride, oxide, carbonate, and fluoride, each of which comprises an A element (here, A is at least one kind or two or more kinds of elements selected from the group consisting of Mg, Ca, Sr, and Ba), an M element (here, M is at least one kind or two or more kinds of elements selected from the group consisting of Mn, Eu, Ce, Nd, Tb, Dy, Ho, Er, Tm, and Yb), a D element (here, D is one kind or two or more kinds of elements selected from the group consisting of Si and Al) and, if necessary, a G element (here, G is Li element) may be employed.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing.

The firing temperature may be 1400 °C or higher and 2200 °C or lower. If the temperature is lower than 1400 °C, the reaction may not proceed sufficiently. If the temperature is higher than 2200 °C, the raw material powder or the synthesized compound may be decomposed. The firing time depends on the firing temperature, but it is usually from one hour to 48 hours or so.

The nitrogen-containing inert atmosphere in the pressure range of 0.1 MPa or more to 100 MPa or less is preferable because thermal decomposition of nitride or oxynitride of the starting raw material or the product is suppressed. It is preferable that the oxygen partial pressure is 0.0001% or lower in the firing atmosphere in order to suppress the oxidation reaction of nitride or oxynitride of the starting raw material or the product.

In order to manufacture the phosphor in the form of powder or aggregate, it may be good to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material.

Although various kinds of heat-resistant materials can be used for the container containing the raw material compound in firing the raw material mixture, in view of a low adverse effect of material deterioration on the metal nitride used in the embodiment of present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002, or a boron nitride sintered body. When the firing is performed under such condition, boron or boron nitride component may be mixed into the product from the container, but, if the amount thereof is small, an effect of mixing is slight since the emission characteristics are not deteriorated. Further, durability of the product may be occasionally improved by the addition of a small amount of boron nitride thereto, and such addition may be preferable in some cases.

In order to manufacture the phosphor in the form of powder or aggregate, it is preferable to make the mean particle diameter of powder particles or aggregate of the raw material equal to or less than 500 μm since the raw material has excellent reactivity and handling characteristics.

As a method of adjusting a particle size of the particles or aggregates to be 500 μm or less, it is preferable to employ a spray dryer, sieving, or pneumatic classification since such a method has excellent operating efficiency and handling characteristics.

As a method of firing, not the hot-pressing, but a method of firing, in which no external mechanical pressing is applied, such as pressureless sintering method and gas pressure sintering method is preferable as a method of obtaining a product of powder or aggregate.

A mean particle diameter of phosphor powder is preferably 50 nm or more and 200 μm or less in terms of a volume-based median diameter (d50) because the emission intensity is high. The volume-based mean particle diameter can be measured, for example, by a Microtrac or a laser light scattering method. A mean particle diameter of phosphor powder synthesized by firing may be satisfactorily adjusted to be 50 nm or larger and 200 μm or smaller by applying one kind or a plurality of kinds of methods selected from pulverization, classification, and acid treatment.

Defects included in the powder and damages caused by pulverization may be occasionally cured by heat-treating the phosphor powder after firing, the phosphor powder after pulverizing treatment, or the phosphor powder after controlling a particle size at a temperature of 1,000 °C or higher to the firing temperature or lower. The defects and damages may occasionally cause a decrease in the emission intensity, and in such a case, the emission intensity may be recovered by the heat treatment.

During firing for synthesis of the phosphor, a stable crystal may be occasionally obtained by adding an inorganic substance forming a liquid phase at a temperature of a firing temperature or lower and firing a mixture thereof such that the liquid phase acts as a flux to promote the reaction and particle growth, and thus the emission intensity may be occasionally improved.

Specific examples of the inorganic substance forming the liquid phase at the temperature of the firing temperature or lower include a single substance or a mixture of two or more kinds of fluoride, chloride, iodide, bromide, or phosphate of one or two or more kinds of elements selected from the group consisting of Li, Na, K, Mg, Ca, Sr, and Ba. These inorganic substances have different melting points, respectively, and therefore may be satisfactorily used properly depending on a synthesizing temperature.

Further, the emission intensity of the phosphor may occasionally become high by reducing the content amount of the inorganic substance forming the liquid phase at the temperature of the firing temperature or lower by washing the phosphor with a solvent after the firing.

In an embodiment of the present invention, when a phosphor is used in an application of a light-emitting device or the like, it is preferable to use such a phosphor dispersed in a liquid medium. Also, in an embodiment of the present invention, the phosphor can be used as the phosphor mixture including phosphors. In an embodiment of the present invention, a composition prepared by dispersing the phosphor in the liquid medium is referred to as a phosphor-containing composition.

In an embodiment of the present invention, as the usable medium for the phosphor-containing composition, the liquid medium may be what can disperse suitably the phosphor of the embodiment of the present invention. As long as it would not cause an undesirable reaction or the like, any kind of medium can be selected in accordance with an object or the like. As an example of the medium or media, there are provided glass, silicone resin, epoxy resin, polyvinyl resin, polyethylene resin, polypropylene resin, polyester resin and the like. With respect to the media, a single kind of liquid medium may be used by itself, or any combination of two or more kinds of liquid media with any combination ratio thereof may be used.

The amount of used liquid medium or media may be appropriately adjusted depending on an application or the like, but, in general, the amount is in the range of usually 3 wt % or more, preferably 5 wt % or more, and usually 30 wt % or less or preferably 15 wt % or less in terms of the weight ratio of the liquid medium or media to the phosphor.

In an embodiment of the present invention, a light-emitting element may be configured with at least an excitation source (emission source) and a phosphor of an embodiment the present invention. As the emission source, there are a light-emitting diode (LED), a laser diode (LD), a fluorescent lamp, and so on. With respect to the LED, it can be manufactured using a phosphor of an embodiment of the present invention by the publicly known method, which is described in Japanese Patent Application Publication No. H05(1993)-152609, Japanese Patent Application Publication No. H07(1995)-99345, Japanese Patent No. 2927279, and the like. In such a case, the light-emitting body or the emission source is preferably what emits light having a wavelength that is 300 nm or longer and 600 nm or shorter, and an ultraviolet (or violet) LED light-emitting element emitting light having a wavelength that is 300 nm or longer and 420 nm or shorter, a blue LED light-emitting element emitting light having a wavelength that is 420 nm or longer and 500 nm or shorter, a green, yellow, or red LED light-emitting element emitting light having a wavelength that is 500 nm or longer and 600 nm or shorter, and the like can be used. As such LEDs, there is what is configured with a semiconductor such as GaN, InGaN, and AlGaAs and it could be an emission source emitting light having a predetermined wavelength by adjusting the composition.

In an embodiment of the present invention, as one example of the light-emitting element, a phosphor emitting fluorescence light having a maximum value of an emission peak at a wavelength in a range that is 400 nm or longer and 760 nm or shorter upon irradiation of light emitting light having any wavelength in a range that is 300 nm or longer and 600 nm or shorter can be included in addition to the phosphor of the embodiment of the present invention. A single or a plurality of phosphors may be included as such a phosphor. In this way, a light-emitting element emitting light including color components of a violet color component of 400 nm, a blue color component, a green color component, a yellow color component, a red color component, and an infrared color component can be configured.

In an embodiment of the present invention, as one example of the light-emitting element, a blue color phosphor emitting light having a wavelength that is 400 nm or longer and 500 nm or shorter upon irradiation of the light-emitting body or the emission source can be included in addition to the phosphor of the embodiment of the present invention. As such phosphors, there are AlN:(Eu, Si), $BaMgAl_{10}O_{17}$:Eu, $SrSi_9Al_{19}ON_{31}$:Eu, $LaSi_9Al_{19}N_{32}$:Eu, α-sialon:Ce, JEM:Ce and the like.

In an embodiment of the present invention, as one example of the light-emitting element, a green phosphor emitting light having a peak wavelength that is 500 nm or longer and 550 nm or shorter upon irradiation of a light-emitting body or an emission source can be included in addition to the phosphor of the embodiment of the present invention. As examples of such a green phosphor, there are r-sialon:Eu, (Ba, Sr, Ca, Mg)$_2$SiO$_4$:Eu, (Ca, Sr, Ba)$Si_2O_2N_2$:Eu, and so on.

In an embodiment of the present invention, as one example of the light-emitting element, a yellow phosphor emitting light having a peak wavelength that is 550 nm or longer and 600 nm or shorter upon irradiation of a light-emitting body or an emission source can be included in addition to the phosphor of the embodiment of the present invention. As examples of such a yellow phosphor, there are YAG:Ce, α-sialon:Eu, $CaAlSiN_3$:Ce, $La_3Si_6N_{11}$:Ce, and so on.

In an embodiment of the present invention, as one example of the light-emitting element, a red phosphor emitting light having a peak wavelength that is 600 nm or longer and 700 nm or shorter upon irradiation of a light-emitting body or an emission source can be included in addition to the phosphor of the embodiment of the present invention. As examples of such a red phosphor, there are $CaAlSiN_3$:Eu, (Ca, Sr)$AlSiN_3$:Eu, $Ca_2Si_5N_8$:Eu, $Sr_2Si_5N_8$:Eu, and so on.

In an embodiment of the present invention, as one example of the light-emitting element, if a light-emitting body or an emission source uses an LED emitting light having a wavelength in a range that is 320 nm or longer and 500 nm or shorter, the emission efficiency is high such that a light emitting device with high efficiency can be configured.

In an embodiment of the present invention, a light-emitting device includes the above-mentioned light emitting element and, as such a light-emitting device, there are an illuminating device, a backlight for a liquid crystal panel, a lamp for a projector, an infrared lighting device, a light source for an infrared measuring device, and so on. It is confirmed that a phosphor in an embodiment of the present invention emits light upon excitation by an electron beam, a vacuum ultraviolet ray of 100 nm to 190 nm, an ultraviolet ray of 190 nm to 380 nm, visible light of 380 nm to 600 nm, and the like, and a light-emitting device as mentioned above can be configured by combining these excitation sources and phosphors of the embodiment of the present invention.

A phosphor in an embodiment of the present invention, which includes an inorganic substance crystal phase having a specific chemical composition, can be used as a pigment or a fluorescent pigment since it has a red object color. That is, in the embodiment of the present invention, the red object color is observed if illumination light such as sunlight and fluorescent light is irradiated on the phosphor and coloration thereof is excellent and does not deteriorate for a long time such that the phosphor in the embodiment of the present invention is suitable for an inorganic pigment. Therefore, when the phosphor is used for a paint, ink, color, glaze, colorant to be added to a plastic product or the like, a favorable coloring can be maintained at a high level for a long period of time.

In an embodiment of the present invention, a phosphor absorbs an ultraviolet ray so as to be suitable as an ultraviolet absorber. Thus, when the phosphor is used as the paint or applied onto a surface of the plastic product or kneaded into an inside thereof, a shielding effect thereof against the ultraviolet ray is so high that the product may be effectively protected from the ultraviolet degradation.

In an embodiment of the present invention, as another light-emitting device, there are an illuminating device, a backlight for a liquid crystal panel, and so on, which include a white light-emitting diode, a red light-emitting diode, a diode emitting white light and infrared light, or a plurality of these diodes, and a phosphor in an embodiment of the present invention.

Embodiment

The present invention will be explained more in detail using embodiments as shown below, but it is merely disclosed for the purpose of facilitating understanding the present invention readily such that the present invention is not limited to these embodiments.

<<Raw Material Power>>

The raw material powders used for the synthesis were: silicon nitride powder with a particle size of specific surface area of 11.2 $m^2/g$, oxygen content of 1.29 wt %, and a type content of 95% (SN-E10 grade made by Ube Industries, Ltd.); aluminum nitride powder with a particle size of specific surface area of 3.3 $m^2/g$ and oxygen content of 0.82% by weight (Grade E manufactured by Tokuyama Corporation); aluminum oxide powder with a particle size of specific surface area of 13.2 $m^2/g$ (TAIMICRON manufactured by Taimei Chemicals Co., Ltd.); lithium nitride ($Li_3N$: manufactured by Kojundo Chemical Laboratory Co., Ltd.) powder; magnesium nitride ($Mg_3N_2$: manufactured by Kojundo Chemical Laboratory Co., Ltd.); calcium nitride ($Ca_3N_2$: manufactured by Kojundo Chemical Laboratory Co., Ltd.); 99.5% pure strontium nitride ($Sr_3N_2$: manufactured by Materion); 99.7% pure barium nitride ($Ba_3N_2$: manufactured by Materion); europium nitride (EuN: manufactured by Materion); rare earth nitrides (manufactured by Materion); and rare earth oxides (purity of 99.9%; manufactured by Shin-Etsu Chemical Co., Ltd.).

<<Structure Analysis of Present Crystal>>

A $Sr_3Si_{12.432}Al_{8.568}O_{1.608}N_{26.392}Li_{0.96}$ crystal was synthesized and a crystal structure thereof was analyzed.

Silicon nitride ($Si_3N_4$), aluminum nitride (AlN), aluminum oxide ($Al_2O_3$), lithium nitride ($Li_3N$), and strontium nitride ($Sr_3N_2$) were weighed such that molar ratios of $Si_3N_4$, AlN, $Al_2O_3$, $Li_3N$, and $Sr_3N_2$ would be 4.144, 7.496, 0.536, 0.32, and 1 so as to make a composition of $Sr_3Si_{12.432}Al_{8.568}O_{1.608}N_{26.392}Li_{0.96}$ and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of $1\times10^{-1}$ Pa or less with a diffusion pump, and heated from the room temperature to 800 °C at a rate of 500 °C per hour. Nitrogen of 99.999 vol % purity was introduced at 800 °C to raise the pressure inside the furnace to 1 MPa, and the temperature was further raised to 1900 °C at a rate of 500 °C per hour, and then the temperature was maintained for two (2) hours.

A synthesized compound was observed by means of an optical microscope and a crystal particle having a size of 40 μm was collected out of the synthesized compound. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Sr, Si, and Al elements was confirmed, and it was confirmed that the composition was the same as designed.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure of the crystal was determined using single crystal structure analysis software (APEX2 made by Bruker AXS Inc.) from the results of X-ray diffraction measurement. The crystal structure data thus-obtained are shown in Table 1, and a diagram of the crystal structure is shown in FIG. 1. The crystal system, the space group, the lattice constants, and the kinds and positions of atoms are described in Table 1, and the shape and the size of the unit cell and the arrangement of atoms therein can be determined using the data.

It was found that the crystal belonged to the hexagonal system, and belonged to the space group $P6_3$ (the 173th space group of the International Tables for Crystallography), and the lattice constants:

$$a = b = 1.7416 \text{ nm},$$

$$c = 0.48775 \text{ nm},$$

$$\text{angles } \alpha = \beta = 90°,$$

$$\text{angle } \gamma = 120°$$

were determined. Further, the atom positions were determined as shown in Table 1. Here, Si and Al existed in the equivalent atom positions B with a certain ratio thereof, which was determined by the atomic ratios by EDS. Here, O and N existed in the equivalent atom positions X with a certain ratio thereof, which was determined by condition of electrical neutrality. The composition of the crystal obtained from the single crystal X-ray structure analysis was $Sr_3Si_{12.432}Al_{8.568}O_{1.608}N_{26.392}Li_{0.96}$.

From the crystal structure data, it was confirmed that the crystal was a new substance having not been reported so far.

Figure 2:
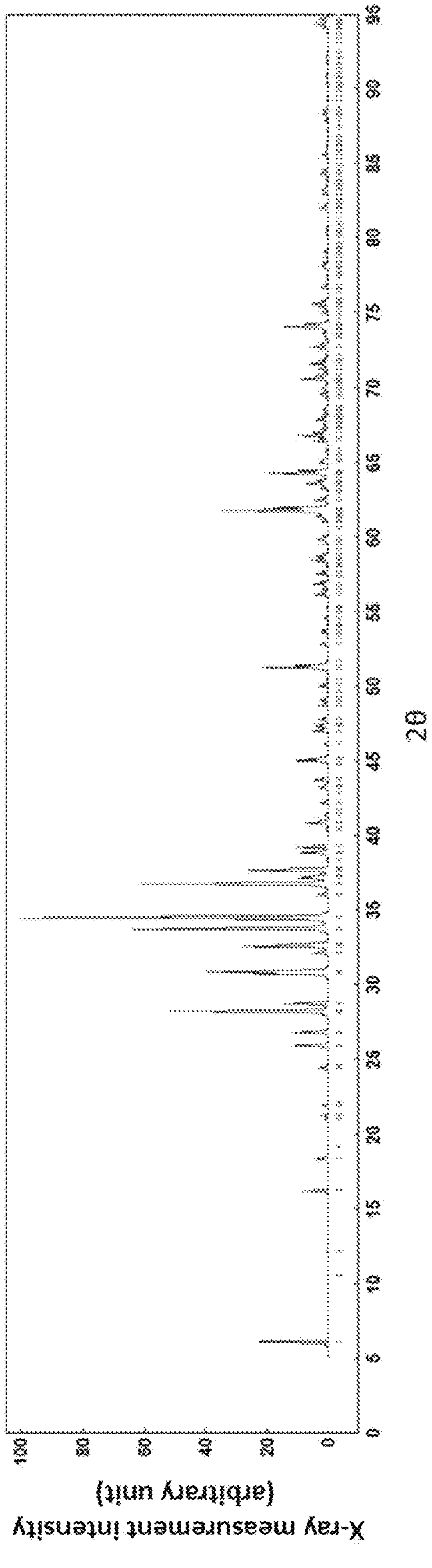
FIG. 2 shows a diagram illustrating a powder X-ray diffraction pattern using the Cu Kα line calculated from the crystal structure of the crystal structure of $Sr_3Si_{12.432}Al_{8.568}O_{1.608}N_{26.392}Li_{0.96}$ crystal.

FIG. 2 shows a diagram illustrating a powder X-ray diffraction pattern with the Cu Kα line calculated from the crystal structure of the $Sr_3Si_{12.432}Al_{8.568}O_{1.608}N_{26.392}Li_{0.96}$ crystal.

Therefore, it is possible to determine the formation of the crystal $Sr_3Si_{12.432}Al_{8.568}O_{1.608}N_{26.392}Li_{0.96}$ by performing a powder X-ray diffraction measurement of the synthesized compound and comparing the measured powder X-ray diffraction pattern with that of FIG. 2 to find they are substantially the same. Further, since the powder X-ray pattern can be calculated from values of the lattice constants obtained from the powder X-ray diffraction measurement and the crystal structure data of Table 1 with respect to what retains the same crystal structure and has the varied lattice constants, the formation of the present crystal can be judged by comparing the measured pattern with the calculated pattern.

From the structure analysis of the $Sr_3Si_{12.432}Al_{8.568}O_{1.608}N_{26.392}Li_{0.96}$ crystal, it was found that (1) Si and Al occupy the same sites such that they can be substituted each other;

(2) O and N occupy the same sites such that they can be substituted each other;

(3) the sites of Sr in the crystal and the sites of (Si, Al) (O, $N)_4$ can be substituted; and (4) the amount of Li can be changed;

such that the present crystal can be represented using parameters x and y by $Sr_{6x}(Si, Al)_{27-12x}(O, N)_{31-6x}Li_{3y}$, where $$x = 0.5,$$

$$y = 0.32,$$

$$Al/(Al + Si) = 8.568/21, \text{ and}$$

$$O/(O + N) = 1.608/28.$$

While crystals were synthesized with various compositions, the thus-obtained crystals could be represented by $Sr_{6x}$ (Si, $Al)_{27-12x}(O, N)_{31-6x}Li_{3y}$.

It was found that the present crystal structure was made as the parameters x and y satisfied in a range of $$0.4 \le x \le 0.8 \text{ and}$$

$$0 \le y \le 0.35.$$

As the values of x and y are changed, the occupancy rates of A01, A02, B06, B07, B08, B09, C01, X10, and X11 in Table 1 are changed.

Further, it was found that as the syntheses were made with various kinds of elements, the sites for Sr can be substituted by those for the A element and the M element. Here, the A element is an element selected from the group consisting of Mg, Ca, Sr, and Ba; and the M element is an element selected from the group consisting of Mn, Eu, Ce, Nd, Tb, Dy, Ho, Er, Tm, and Yb. From these results, it was found that the present crystal and the present identical crystal could be represented by the general formula of $(A, M)_{6x}D_{27-12x}E_{31-6x}G_{3y}$. Here, the E element is O and/or N and the G element is Li.

<<Phosphor Synthesis>>

[Experiment 1]

Next, the phosphor of $(Sr, Eu)_{6x}(Si, Al)_{27-12x}(O, N)_{31-6x}Li_{3y}$ having $Sr_{6x}(Si, Al)_{27-12x}(O, N)_{31-6x}Li_{3y}$ where x=0.5 and y=0.28 as the host crystal was synthesized.

A mixture composition was designed so as to make the composition of $(Sr_{2.9}, Eu_{0.1})(Si_{12.6}, Al_{8.4})(O_{1.56}, N_{26.44})Li_{0.84}$ by mixing silicon nitride ($Si_3N_4$), aluminum nitride (AlN), aluminum oxide ($Al_2O_3$), lithium nitride ($Li_3N$), strontium nitride ($Sr_3N_2$), and europium nitride (EuN). Here, the composition was designed by assuming that Eu in the raw material EuN would be changed to be divalent during the firing step although it was trivalent in the raw material, and excess nitrogen would be released out of the sample.

The raw material powders were weighed to make the mole ratios of $Si_3N_4$:31.281, AlN:55.0075, $Al_2O_3$:3.8864, $Li_3N$:2.09268, $Sr_3N_2$:7.1996, and EuN:0.74479 and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of $1\times10^{-1}$ Pa or less with a diffusion pump, and heated from the room temperature to 800 °C at a rate of 500 °C per hour. Nitrogen of 99.999 vol % purity was introduced at 800 °C to raise the pressure inside the furnace to 1 MPa, and the temperature was further raised to 1900 °C at a rate of 500 °C per hour, and then the temperature was maintained for two (2) hours.

A synthesized compound was observed by means of an optical microscope and a crystal particle having a size of 40 μm was collected out of the synthesized compound. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Sr, Eu, Si, and Al elements was confirmed, and it was confirmed that the composition was the same as designed.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

The crystal structure of the crystal was determined using single crystal structure analysis software (APEX2 made by Bruker AXS Inc.) from the results of X-ray diffraction measurement. The crystal structure thus-obtained was the same as that of the present crystal. Here, Sr and Eu exist in the equivalent atom positions with a certain ratio, and oxygen and nitrogen exist in the equivalent atom positions with a certain ratio, such that the composition rates of the crystal are determined by averaging their fractions as a whole.

Next, a collected crystal particle was measured with respect to the excitation and emission spectra using a fluorescence spectrophotometer FP8600 made by JASCO Corporation. The experimental results were shown in FIG. 3.

Figure 3:
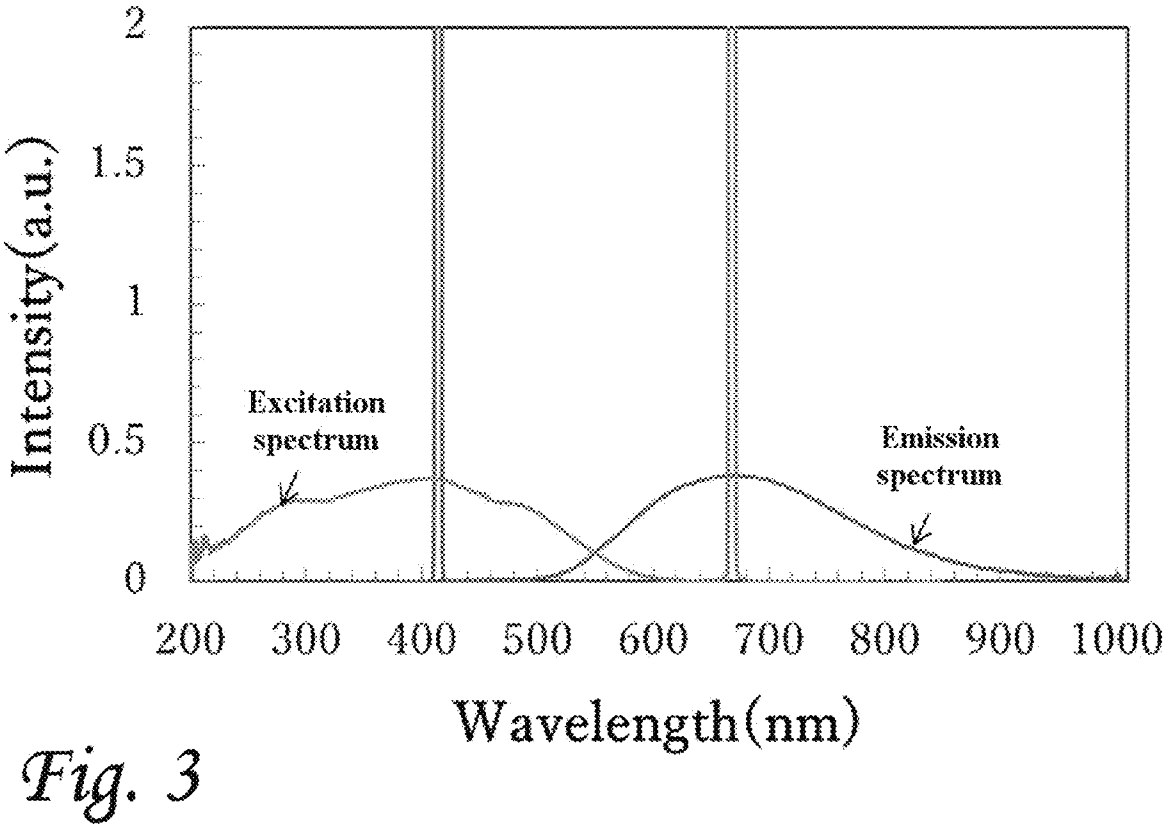
FIG. 3 shows a diagram depicting an emission spectrum of a phosphor synthesized in Experiment 1.

FIG. 3 is a diagram showing an emission spectrum of the phosphor synthesized in Experiment 1.

According to FIG. 3, it was found that the sample of Experiment 1 was a phosphor being excited by light having a wavelength of 410 nm and emitting red light having a maximum value of an emission peak at a wavelength of 667 nm.

[Experiments 2-37]

Raw materials were mixed in the compositions as shown in Table 2 and the same manufacturing method as used in Experiment 1 was employed so as to synthesize $(A, M)_{6x}D_{27-12x}E_{31-6x}G_{3y}$ phosphor. Crystal particles were collected from the synthesized materials and their crystal phases were identified with the single crystal X-ray diffractometer such that it was confirmed that they had the identical crystal structure to that of $Sr_3Si_{12.432}Al_{8.568}O_{1.608}N_{26.392}Li_{0.96}$ as shown in Table 1. Excitation spectra of these powders were measured. The results are shown in Table 3 and FIG. 4.

TABLE 2

Lists of composition parameters of samples of Experiments 1-37

| | Parameters | | | | Elemental composition ratios | | | | | | | | |
|---|---|---|---|---|---|---|---|---|---|---|---|---|---|
| Experiments | x | y | a | b | Eu | Sr | Mg | Ba | Li | Al | Si | O | N |
| 1 | 0.5 | 0.2800 | 0.4 | 0.0557 | 0.1 | 2.9 | | | 0.84 | 8.4 | 12.6 | 1.56 | 26.44 |
| 2 | 0.5 | 0.2800 | 0.4 | 0.0557 | 1 | 2 | | | 0.84 | 8.4 | 12.6 | 1.56 | 26.44 |
| 3 | 0.5 | 0.2800 | 0.4 | 0.0557 | 0.03 | 2.97 | | | 0.84 | 8.4 | 12.6 | 1.56 | 26.44 |
| 4 | 0.5 | 0.2800 | 0.4 | 0.0557 | 0.3 | 2.7 | | | 0.84 | 8.4 | 12.6 | 1.56 | 26.44 |
| 5 | 0.5 | 0.2800 | 0.4 | 0.0557 | 2 | 1 | | | 0.84 | 8.4 | 12.6 | 1.56 | 26.44 |

TABLE 2-continued

Lists of composition parameters of samples of Experiments 1-37

| Experiments | Parameters | | | | Elemental composition ratios | | | | | | | | |
|---|---|---|---|---|---|---|---|---|---|---|---|---|---|
| | x | y | a | b | Eu | Sr | Mg | Ba | Li | Al | Si | O | N |
| 6 | 0.5 | 0.2800 | 0.4 | 0.0557 | 3 | 0 | | | 0.84 | 8.4 | 12.6 | 1.56 | 26.44 |
| 7 | 0.5 | 0.0700 | 0.4 | 0.0782 | 0.1 | 2.9 | | | 0.21 | 8.4 | 12.6 | 2.19 | 25.81 |
| 8 | 0.5 | 0.1400 | 0.4 | 0.0707 | 0.1 | 2.9 | | | 0.42 | 8.4 | 12.6 | 1.98 | 26.02 |
| 9 | 0.5 | 0.2100 | 0.4 | 0.0632 | 0.1 | 2.9 | | | 0.63 | 8.4 | 12.6 | 1.77 | 26.23 |
| 10 | 0.5 | 0.3500 | 0.4 | 0.0482 | 0.1 | 2.9 | | | 1.05 | 8.4 | 12.6 | 1.35 | 26.65 |
| 11 | 0.5 | 0.2800 | 0.35 | 0.0182 | 0.1 | 2.9 | | | 0.84 | 7.35 | 13.65 | 0.51 | 27.49 |
| 12 | 0.5 | 0.2800 | 0.4 | 0.0557 | 0.1 | 2.9 | | | 0.84 | 8.4 | 12.6 | 1.56 | 26.44 |
| 13 | 0.5 | 0.2800 | 0.4 | 0.0557 | 0.1 | | 2.9 | | 0.84 | 8.4 | 12.6 | 1.56 | 26.44 |
| 14 | 0.5 | 0.2800 | 0.4 | 0.0557 | 0.1 | | | 2.9 | 0.84 | 8.4 | 12.6 | 1.56 | 26.44 |
| 15 | 0.5 | 0.2800 | 0.4 | 0.0557 | 0.1 | 2.175 | | 0.725 | 0.84 | 8.4 | 12.6 | 1.56 | 26.44 |
| 16 | 0.5 | 0.2800 | 0.4 | 0.0557 | 0.1 | 1.45 | | 1.45 | 0.84 | 8.4 | 12.6 | 1.56 | 26.44 |
| 17 | 0.5 | 0.2800 | 0.4 | 0.0557 | 0.1 | 0.725 | | 2.175 | 0.84 | 8.4 | 12.6 | 1.56 | 26.44 |
| 18 | 0.5 | 0.2800 | 0.4 | 0.0557 | 0.1 | 2.9 | | | 0.84 | 8.4 | 12.6 | 1.56 | 26.44 |
| 19 | 0.5 | 0.2667 | 0.4 | 0.0571 | 0.1 | 2.9 | | | 0.8 | 8.4 | 12.6 | 1.6 | 26.4 |
| 20 | 0.5 | 0.2933 | 0.4 | 0.0543 | 0.1 | 2.9 | | | 0.88 | 8.4 | 12.6 | 1.52 | 26.48 |
| 21 | 0.5 | 0.2800 | 0.4. | 0.0557 | 0.08 | 2.92 | | | 0.84 | 8.4 | 12.6 | 1.56 | 26.44 |
| 22 | 0.5 | 0.2800 | 0.4 | 0.0557 | 0.12 | 2.88 | | | 0.84 | 8.4 | 12.6 | 1.56 | 26.44 |
| 23 | 0.5 | 0.2800 | 0.36 | 0.0257 | 0.1 | 2.9 | | | 0.84 | 7.56 | 13.44 | 0.72 | 27.28 |
| 24 | 0.5 | 0.2800 | 0.4 | 0.0557 | 1 | 2 | | | 0.84 | 8.4 | 12.6 | 1.56 | 26.44 |
| 25 | 0.5 | 0.2667 | 0.4 | 0.0571 | 1 | 2 | | | 0.8 | 8.4 | 12.6 | 1.6 | 26.4 |
| 26 | 0.5 | 0.2933 | 0.4 | 0.0543 | 1 | 2 | | | 0.88 | 8.4 | 12.6 | 1.52 | 26.48 |
| 27 | 0.5 | 0.2800 | 0.4 | 0.0557 | 0.8 | 2.2 | | | 0.84 | 8.4 | 12.6 | 1.56 | 26.44 |
| 28 | 0.5 | 0.2800 | 0.4 | 0.0557 | 1.2 | 1.8 | | | 0.84 | 8.4 | 12.6 | 1.56 | 26.44 |
| 29 | 0.5 | 0.2800 | 0.35 | 0.0182 | 0.1 | 2.9 | | | 0.84 | 7.35 | 13.65 | 0.51 | 27.49 |
| 30 | 0.5 | 0.2667 | 0.35 | 0.0196 | 0.1 | 2.9 | | | 0.8 | 7.35 | 13.65 | 0.55 | 27.45 |
| 31 | 0.5 | 0.2933 | 0.35 | 0.0168 | 0.1 | 2.9 | | | 0.88 | 7.35 | 13.65 | 0.47 | 27.53 |
| 32 | 0.5 | 0.2800 | 0.35 | 0.0182 | 0.08 | 2.92 | | | 0.84 | 7.35 | 13.65 | 0.51 | 27.49 |
| 33 | 0.5 | 0.2800 | 0.35 | 0.0182 | 0.12 | 2.88 | | | 0.84 | 7.35 | 13.65 | 0.51 | 27.49 |
| 34 | 0.5 | 0.2800 | 0.33 | 0.0032 | 0.1 | 2.9 | | | 0.84 | 6.93 | 14.07 | 0.09 | 27.91 |
| 35 | 0.5 | 0.2800 | 0.34 | 0.0107 | 0.1 | 2.9 | | | 0.84 | 7.14 | 13.86 | 0.3 | 27.7 |
| 36 | 0.5 | 0.2800 | 0.36 | 0.0257 | 0.1 | 2.9 | | | 0.84 | 7.56 | 13.44 | 0.72 | 27.28 |
| 37 | 0.5 | 0.2800 | 0.37 | 0.0332 | 0.1 | 2.9 | | | 0.84 | 7.77 | 13.23 | 0.93 | 27.07 |

a = Al/(Al + Si)
b = O/(O + N)

TABLE 3

Lists of emission characteristics of samples of Experiments 1-37

| Experiments | Emission characteristics | | |
|---|---|---|---|
| | Excitation wavelength (nm) | Emission wavelength (nm) | Emission intensity Arbitrary unit |
| 1 | 410 | 667 | 0.39 |
| 2 | 424 | 741 | 0.28 |
| 3 | 412 | 668 | 0.28 |
| 4 | 411 | 699 | 0.4 |
| 5 | 412 | 756 | 0.16 |
| 6 | 456 | 769 | 0.11 |
| 7 | 453 | 612 | 0.66 |
| 8 | 453 | 609 | 0.65 |
| 9 | 453 | 624 | 0.37 |
| 10 | 411 | 689 | 0.34 |
| 11 | 415 | 609 | 0.74 |
| 12 | 411 | 688 | 0.33 |
| 13 | 336 | 632 | 0.82 |
| 14 | 453 | 654 | 0.45 |
| 15 | 411 | 706 | 0.36 |
| 16 | 453 | 656 | 0.75 |
| 17 | 453 | 653 | 0.75 |
| 18 | 415 | 669 | 0.41 |
| 19 | 408 | 674 | 0.41 |
| 20 | 408 | 682 | 0.39 |
| 21 | 408 | 676 | 0.38 |
| 22 | 412 | 686 | 0.4 |
| 23 | 411 | 627 | 0.4 |
| 24 | 425 | 738 | 0.28 |
| 25 | 416 | 733 | 0.29 |
| 26 | 415 | 738 | 0.3 |

TABLE 3-continued

Lists of emission characteristics of samples of Experiments 1-37

| Experiments | Emission characteristics | | |
|---|---|---|---|
| | Excitation wavelength (nm) | Emission wavelength (nm) | Emission intensity Arbitrary unit |
| 27 | 417 | 732 | 0.34 |
| 28 | 425 | 744 | 0.27 |
| 29 | 424 | 613 | 0.76 |
| 30 | 453 | 615 | 0.69 |
| 31 | 422 | 615 | 0.74 |
| 32 | 453 | 616 | 0.68 |
| 33 | 416 | 617 | 0.56 |
| 34 | 424 | 615 | 0.74 |
| 35 | 453 | 619 | 0.69 |
| 36 | 411 | 621 | 0.5 |
| 37 | 412 | 638 | 0.37 |

As shown in Table 3, each of the samples obtained in Experiments 2-37 had a maximum value of an emission peak at a wavelength of 600 nm or longer and was a phosphor emitting red or near-infrared light.

Figure 4:
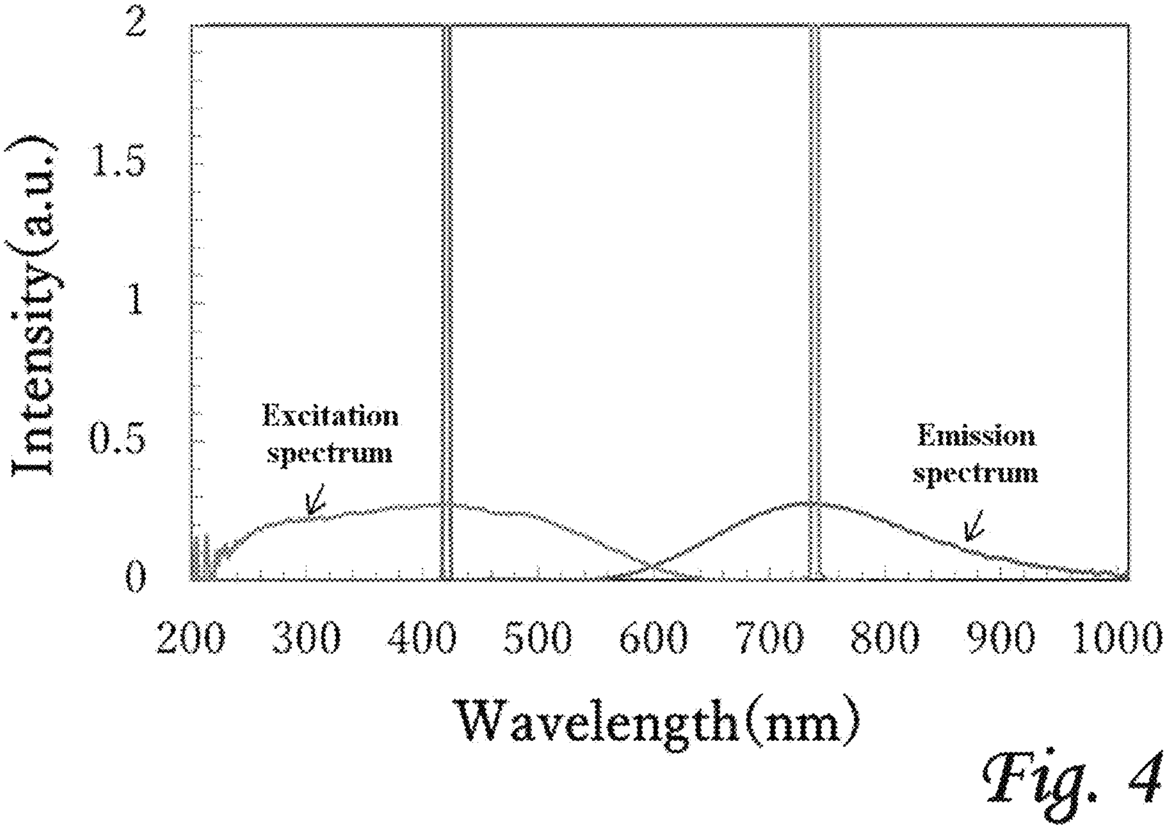
FIG. 4 shows a diagram depicting an emission spectrum of a phosphor synthesized in Experiment 2.

FIG. 4 shows a diagram showing an emission spectrum of the phosphor synthesized in Experiment 2.

It was found that the sample synthesized in Experiment 2 was $(Sr_2, Eu_1)(Si_{12.6}, Al_{8.4})(O_{1.56}, N_{26.44})Li_{0.84}$ and a phosphor emitting infrared light having a maximum value of an emission peak at a wavelength of 741 nm upon excitation by light having a wavelength of 424 nm.

[Experiments 38-101]

Raw materials were mixed in the compositions as shown in Tables 4 and 5 and the same manufacturing method as used in Experiment 1 was employed so as to synthesize $(A, M)_{6x}D_{27-12x}E_{31-6x}G_{3y}$ phosphor. Crystal particles were collected from the synthesized materials and their crystal phases were identified with the single crystal X-ray diffractometer such that it was confirmed that, excluding the samples synthesized in Experiments 59 and 69, they had the identical crystal structure to that of $Sr_3Si_{12.432}Al_{8.568}O_{1.608}N_{26.392}Li_{0.96}$ as shown in Table 1. Here, Experiments 59 and 69 are reference experiment examples.

TABLE 4

Lists of composition parameters of samples of Experiments 38-69

| | Parameters | | | | Elemental composition ratios | | | | | | | | | |
|---|---|---|---|---|---|---|---|---|---|---|---|---|---|---|
| Experiments | x | y | a | b | Eu | Sr | Mg | Ca | Ba | Li | Al | Si | O | N |
| 38 | 0.4 | 0 | 0.6 | 0.1930 | 0.1 | 2.3 | | | | | 13.32 | 8.88 | 5.52 | 23.08 |
| 39 | 0.5 | 0 | 0.6 | 0.2357 | 0.1 | 2.9 | | | | | 12.6 | 8.4 | 6.6 | 21.4 |
| 40 | 0.6 | 0 | 0.6 | 0.2803 | 0.1 | 3.5 | | | | | 11.88 | 7.92 | 7.58 | 19.72 |
| 41 | 0.7 | 0 | 0.6 | 0.3269 | 0.1 | 4.1 | | | | | 11.16 | 7.44 | 8.76 | 18.04 |
| 42 | 0.4 | 0 | 0.5 | 0.1154 | 0.1 | 2.3 | | | | | 11.1 | 11.1 | 3.3 | 25.3 |
| 43 | 0.5 | 0 | 0.5 | 0.1607 | 0.1 | 2.9 | | | | | 10.5 | 10.5 | 4.5 | 23.5 |
| 44 | 0.6 | 0 | 0.5 | 0.2080 | 0.1 | 3.5 | | | | | 9.9 | 9.9 | 5.7 | 21.7 |
| 45 | 0.7 | 0 | 0.5 | 0.2575 | 0.1 | 4.1 | | | | | 9.3 | 9.3 | 6.9 | 19.9 |
| 46 | 0.4 | 0 | 0.4 | 0.0378 | 0.1 | 2.3 | | | | | 8.88 | 13.32 | 1.08 | 27.52 |
| 47 | 0.5 | 0 | 0.4 | 0.0857 | 0.1 | 2.9 | | | | | 8.4 | 12.6 | 2.4 | 25.6 |
| 48 | 0.6 | 0 | 0.4 | 0.1358 | 0.1 | 3.5 | | | | | 7.92 | 11.88 | 3.72 | 23.68 |
| 49 | 0.7 | 0 | 0.4 | 0.1881 | 0.1 | 4.1 | | | | | 7.44 | 11.16 | 5.04 | 21.76 |
| 50 | 0.5 | 0 | 0.3 | 0.0107 | 0.1 | 2.9 | | | | | 6.3 | 14.7 | 0.3 | 27.7 |
| 51 | 0.6 | 0 | 0.3 | 0.0635 | 0.1 | 3.5 | | | | | 5.94 | 13.86 | 1.74 | 25.66 |
| 52 | 0.7 | 0 | 0.3 | 0.1187 | 0.1 | 4.1 | | | | | 5.58 | 13.02 | 3.18 | 23.62 |
| 53 | 0.8 | 0 | 0.3 | 0.1763 | 0.1 | 4.7 | | | | | 5.22 | 12.18 | 4.62 | 21.58 |
| 54 | 0.5 | 0.03 | 0.4 | 0.0846 | 0.1 | 2.9 | | | | 0.03 | 8.4 | 12.6 | 2.37 | 25.63 |
| 55 | 0.5 | 0.3 | 0.4 | 0.0750 | 0.1 | 2.9 | | | | 0.3 | 8.4 | 12.6 | 2.1 | 25.9 |
| 56 | 0.5 | 0.9 | 0.4 | 0.0536 | 0.1 | 2.9 | | | | 0.9 | 8.4 | 12.6 | 1.5 | 26.5 |
| 57 | 0.5 | 1.5 | 0.4 | 0.0321 | 0.1 | 2.9 | | | | 1.5 | 8.4 | 12.6 | 0.9 | 27.1 |
| 58 | 0.5 | 3 | 1 | 0.4286 | 0.1 | 2.9 | | | | 3 | 21 | 0 | 12 | 16 |
| 59 | 0.5 | 0 | 0.4 | 0.0857 | 0 | 3 | | | | | 8.4 | 12.6 | 2.4 | 25.6 |
| 60 | 0.5 | 0 | 0.4 | 0.0857 | 0.001 | 2.999 | | | | | 8.4 | 12.6 | 2.4 | 25.6 |
| 61 | 0.5 | 0 | 0.4 | 0.0857 | 0.003 | 2.997 | | | | | 8.4 | 12.6 | 2.4 | 25.6 |
| 62 | 0.5 | 0 | 0.4 | 0.0857 | 0.01 | 2.99 | | | | | 8.4 | 12.6 | 2.4 | 25.6 |
| 63 | 0.5 | 0 | 0.4 | 0.0857 | 0.03 | 2.97 | | | | | 8.4 | 12.6 | 2.4 | 25.6 |
| 64 | 0.5 | 0 | 0.4 | 0.0857 | 0.1 | 2.9 | | | | | 8.4 | 12.6 | 2.4 | 25.6 |
| 65 | 0.5 | 0 | 0.4 | 0.0857 | 0.3 | 2.7 | | | | | 8.4 | 12.6 | 2.4 | 25.6 |
| 66 | 0.5 | 0 | 0.4 | 0.0857 | 1 | 2 | | | | | 8.4 | 12.6 | 2.4 | 25.6 |
| 67 | 0.5 | 0 | 0.4 | 0.0857 | 1.5 | 1.5 | | | | | 8.4 | 12.6 | 2.4 | 25.6 |
| 68 | 0.5 | 0 | 0.4 | 0.0857 | 2 | 1 | | | | | 8.4 | 12.6 | 2.4 | 25.6 |
| 69 | 0.5 | 0 | 0.4 | 0.0857 | 3 | 0 | | | | | 8.4 | 12.6 | 2.4 | 25.6 |

a = Al/(Al + Si)
b = O/(O + N)

TABLE 5

Lists of composition parameters of samples of Experiments 70-101

| | Parameters | | | | Elemental composition ratios | | | | | | | | | |
|---|---|---|---|---|---|---|---|---|---|---|---|---|---|---|
| Experiments | x | y | a | b | Eu | Sr | Mg | Ca | Ba | Li | Al | Si | O | N |
| 70 | 0.5 | 0 | 0.6 | 0.2357 | 0.1 | 2.9 | | | | | 12.6 | 8.4 | 6.6 | 21.4 |
| 71 | 0.5 | 0.1 | 0.5 | 0.1500 | 0.1 | 2.8 | 0.1 | | | 0.3 | 10.5 | 10.5 | 4.2 | 23.8 |
| 72 | 0.5 | 0 | 0.4 | 0.0857 | 0.1 | 2.4 | 0.5 | | | | 8.4 | 12.6 | 2.4 | 25.6 |
| 73 | 0.5 | 0.1 | 0.6 | 0.2250 | 0.1 | 1.9 | 1 | | | 0.3 | 12.6 | 8.4 | 6.3 | 21.7 |
| 74 | 0.5 | 0 | 0.5 | 0.1607 | 0.1 | 0.9 | 2 | | | | 10.5 | 10.5 | 4.5 | 23.5 |
| 75 | 0.5 | 0.1 | 0.4 | 0.0750 | 0.1 | | 2.9 | | | 0.3 | 8.4 | 12.6 | 2.1 | 25.9 |
| 76 | 0.5 | 0 | 0.6 | 0.2357 | 0.1 | 2.8 | | 0.1 | | | 12.6 | 8.4 | 6.6 | 21.4 |
| 77 | 0.5 | 0.1 | 0.5 | 0.1500 | 0.1 | 2.4 | | 0.5 | | 0.3 | 10.5 | 10.5 | 4.2 | 23.8 |
| 78 | 0.5 | 0 | 0.4 | 0.0857 | 0.1 | 1.9 | | 1 | | | 8.4 | 12.6 | 2.4 | 25.6 |
| 79 | 0.5 | 0.1 | 0.6 | 0.2250 | 0.1 | 0.9 | | 2 | | 0.3 | 12.6 | 8.4 | 6.3 | 21.7 |
| 80 | 0.5 | 0 | 0.5 | 0.1607 | 0.1 | | | 2.9 | | | 10.5 | 10.5 | 4.5 | 23.5 |
| 81 | 0.5 | 0.1 | 0.4 | 0.0750 | 0.1 | 2.8 | | | 0.1 | 0.3 | 8.4 | 12.6 | 2.1 | 25.9 |
| 82 | 0.5 | 0 | 0.6 | 0.2357 | 0.1 | 2.4 | | | 0.5 | | 12.6 | 8.4 | 6.6 | 21.4 |
| 83 | 0.5 | 0.1 | 0.5 | 0.1500 | 0.1 | 1.9 | | | 1 | 0.3 | 10.5 | 10.5 | 4.2 | 23.8 |
| 84 | 0.5 | 0 | 0.4 | 0.0857 | 0.1 | 0.9 | | | 2 | | 8.4 | 12.6 | 2.4 | 25.6 |
| 85 | 0.5 | 0.1 | 0.6 | 0.2250 | 0.1 | | | | 2.9 | 0.3 | 12.6 | 8.4 | 6.3 | 21.7 |
| 86 | 0.5 | 0 | 0.5 | 0.1607 | 0.1 | 1.9 | 0.5 | 0.5 | | | 10.5 | 10.5 | 4.5 | 23.5 |
| 87 | 0.5 | 0.1 | 0.4 | 0.0750 | 0.1 | 1.9 | 0.5 | | 0.5 | 0.3 | 8.4 | 12.6 | 2.1 | 25.9 |
| 88 | 0.5 | 0 | 0.6 | 0.2357 | 0.1 | 1.9 | | 0.5 | 0.5 | | 12.6 | 8.4 | 6.6 | 21.4 |
| 89 | 0.5 | 0.1 | 0.5 | 0.1500 | 0.1 | 1.9 | 0.5 | | 0.5 | 0.3 | 10.5 | 10.5 | 4.2 | 23.8 |

TABLE 5-continued

Lists of composition parameters of samples of Experiments 70-101

| Experiments | Parameters | | | | Elemental composition ratios | | | | | | | | | |
|---|---|---|---|---|---|---|---|---|---|---|---|---|---|---|
| | x | y | a | b | Eu | Sr | Mg | Ca | Ba | Li | Al | Si | O | N |
| 90 | 0.5 | 0 | 0.4 | 0.0857 | 0.1 | 2.3 | 0.2 | 0.5 | 0.2 | | 8.4 | 12.6 | 2.4 | 25.6 |
| 91 | 0.5 | 0 | 0.6 | 0.2357 | 0.1 | | | | 2.9 | | 12.6 | 8.4 | 6.6 | 21.4 |
| 92 | 0.6 | 0 | 0.4 | 0.1358 | 0.1 | | | | 3.5 | | 7.92 | 11.88 | 3.72 | 23.68 |
| 93 | 0.7 | 0 | 0.4 | 0.1881 | 0.1 | | | | 4.1 | | 7.44 | 11.16 | 5.04 | 21.76 |
| 94 | 0.5 | 0.1 | 0.4 | 0.0750 | 0.1 | | | | 2.9 | 0.3 | 8.4 | 12.6 | 2.1 | 25.9 |
| 95 | 0.6 | 0.1 | 0.4 | 0.1248 | 0.1 | | | | 3.5 | 0.3 | 7.92 | 11.88 | 3.42 | 23.98 |
| 96 | 0.7 | 0.1 | 0.4 | 0.1769 | 0.1 | | | | 4.1 | 0.3 | 7.44 | 11.16 | 4.74 | 22.06 |
| 97 | 0.5 | 0 | 0.6 | 0.2357 | 0.1 | | | | 2.9 | | 12.6 | 8.4 | 6.6 | 21.4 |
| 98 | 0.6 | 0 | 0.5 | 0.2080 | 0.1 | | | | 3.5 | | 9.9 | 9.9 | 5.7 | 21.7 |
| 99 | 0.7 | 0 | 0.4 | 0.1881 | 0.1 | | | | 4.1 | | 7.44 | 11.16 | 5.04 | 21.76 |
| 100 | 0.5 | 0.1 | 0.3 | 0.0000 | 0.1 | | | | 2.9 | 0.3 | 6.3 | 14.7 | 0 | 28 |
| 101 | 0.5 | 0.1 | 1 | 0.5250 | 0.1 | | | | 2.9 | 0.3 | 21 | 0 | 14.7 | 18.3 |

a = Al/(Al + Si)
b = O/(O + N)

While the samples (particles) synthesized in Experiments 38-101 ware irradiated with light of 360 nm, observation was made by the microspectroscopic method and it was confirmed that red to near-infrared light was emitted except the samples synthesized in Experiments 59 and 69. Here, some of the compositions in Tables 4 and 5 are off from $(A, M)_{6x}D_{27-12x}E_{31-6x}G_{3y}$, but, in such a case, the samples are mixtures of the present identical crystal and another phase.

[Experiments 102-113]

Raw materials were mixed in the compositions as shown in Table 6 and the same manufacturing method as used in Experiment 1 was employed so as to synthesize $(A, M)_{6x}D_{27-12x}E_{31-6x}G_{3y}$ phosphor. Crystal particles were collected from the synthesized materials and their crystal phases were identified with the single crystal X-ray diffractometer such that it was confirmed that they had the identical crystal structure to that of $Sr_3Si_{12.432}Al_{8.568}O_{1.608}N_{26.392}Li_{0.96}$ as shown in Table 1.

TABLE 6

Lists of composition parameters of samples of Experiments 102-113

| Experiments | Parameters | | | | Elemental composition ratios | | | | | | | | | |
|---|---|---|---|---|---|---|---|---|---|---|---|---|---|---|
| | x | y | a | b | Sr | Li | Y | La | Lu | M | Al | Si | O | N |
| 102 | 0.5 | 0.28 | 0.4 | 0.0557 | 2.175 | 0.84 | 0.725 | | | Eu 0.1 | 8.4 | 12.6 | 1.56 | 26.44 |
| 103 | 0.5 | 0.28 | 0.4 | 0.0557 | 2.175 | 0.84 | | 0.725 | | Eu 0.1 | 8.4 | 12.6 | 1.56 | 26.44 |
| 104 | 0.5 | 0.28 | 0.4 | 0.0557 | 2.175 | 0.84 | | | 0.725 | Eu 0.1 | 8.4 | 12.6 | 1.56 | 26.44 |
| 105 | 0.5 | 0.28 | 0.4 | 0.0557 | 2.9 | 0.84 | | | | Mn 0.1 | 8.4 | 12.6 | 1.56 | 26.44 |
| 106 | 0.5 | 0.28 | 0.4 | 0.0557 | 2.9 | 0.84 | | | | Ce 0.1 | 8.4 | 12.6 | 1.56 | 26.44 |
| 107 | 0.5 | 0.28 | 0.4 | 0.0557 | 2.9 | 0.84 | | | | Nd 0.1 | 8.4 | 12.6 | 1.56 | 26.44 |
| 108 | 0.5 | 0.28 | 0.4 | 0.0557 | 2.9 | 0.84 | | | | Tb 0.1 | 8.4 | 12.6 | 1.56 | 26.44 |
| 109 | 0.5 | 0.28 | 0.4 | 0.0557 | 2.9 | 0.84 | | | | Dy 0.1 | 8.4 | 12.6 | 1.56 | 26.44 |
| 110 | 0.5 | 0.28 | 0.4 | 0.0557 | 2.9 | 0.84 | | | | Ho 0.1 | 8.4 | 12.6 | 1.56 | 26.44 |
| 111 | 0.5 | 0.28 | 0.4 | 0.0557 | 2.9 | 0.84 | | | | Er 0.1 | 8.4 | 12.6 | 1.56 | 26.44 |
| 112 | 0.5 | 0.28 | 0.4 | 0.0557 | 2.9 | 0.84 | | | | Tm 0.1 | 8.4 | 12.6 | 1.56 | 26.44 |
| 113 | 0.5 | 0.28 | 0.4 | 0.0557 | 2.9 | 0.84 | | | | Yb 0.1 | 8.4 | 12.6 | 1.56 | 26.44 |

a = Al/(Al + Si)
b = O/(O + N)

The samples (particles) synthesized in Experiments 102-113 were irradiated with an ultraviolet ray of 360 nm such that visible to infrared light emission was observed.

As mentioned above, in the embodiment of the present invention, there can be provided a phosphor comprising an inorganic compound represented by $(A, M)_aD_dE_eG_g$ that includes at least an A element, an M element, a D element, an E element (here, A is at least one kind or two or more kinds of elements selected from the group consisting of Mg, Ca, Sr, and Ba; M is at least one kind or two or more kinds of elements selected from the group consisting of Mn, Eu, Ce, Nd, Tb, Dy, Ho, Er, Tm, and Yb; D is one kind or two or more kinds of elements selected from the group consisting of Si and Al; and E is at least one kind or two or more kinds of elements selected from the group consisting of O and N); and, if necessary, a G element (here, G is Li element) wherein atomic fraction parameters: a, d, e, and g satisfy:

$$2.4 \le a \le 4.8,$$

$$17.4 \le d \le 22.2,$$

$$26.2 \le e \le 28.6, \text{ and}$$

$$0 \le g \le 3,$$

and the following concrete composition systems where M is Eu is especially important.

$(Mg, Eu)_aSi_dO_eLi_g$, $(Mg, Eu)_aSi_dO_e$, $(Mg, Eu)_aSi_d(O, N)_eLi_g$, $(Mg, Eu)_aSi_d(O, N)_e$, $(Mg, Eu)_aSi_dN_eLi_g$, $(Mg, Eu)_aSi_dN_e$, $(Mg, Eu)_a(Si, Al)_dO_eLi_g$, $(Mg, Eu)_a(Si, Al)_dO_e$, $(Mg, Eu)_a(Si, Al)_d(O, N)_eLi_g$, $(Mg, Eu)_a(Si, Al)_d(O, N)_e$, $(Mg, Eu)_a(Si, Al)_dN_eLi_g$, $(Mg, Eu)_a(Si, Al)_dN_e$, $(Mg, Eu)_aAl_dO_eLi_g$, $(Mg, Eu)_aAl_dO_e$, $(Mg, Eu)_aAl_d(O, N)_eLi_g$, $(Mg, Eu)_aAl_d(O, N)_e$, (Mg,

Eu)$_a$Al$_d$N$_e$Li$_g$, (Mg, Eu)$_a$Al$_d$N$_e$, (Ca, Eu)$_a$Si$_d$O$_e$Li$_g$, (Ca, Eu)$_a$Si$_d$O$_e$, (Ca, Eu)$_a$Si$_d$(O, N)$_e$Li$_g$, (Ca, Eu)$_a$Si$_d$(O, N)$_e$, (Ca, Eu)$_a$Si$_d$N$_e$Li$_g$, (Ca, Eu)$_a$Si$_d$N$_e$, (Ca, Eu)$_a$(Si, Al)$_d$O$_e$Li$_g$, (Ca, Eu)$_a$(Si, Al)$_d$O$_e$, (Ca, Eu)$_a$(Si, Al)$_d$(O, N)$_e$Li$_g$, (Ca, Eu)$_a$(Si, Al)$_d$(O,N)$_e$, (Ca, Eu)$_a$(Si, Al)$_d$N$_e$Li$_g$, (Ca, Eu)$_a$(Si, Al)$_d$N$_e$, (Ca, Eu)$_a$Al$_d$O$_e$Li$_g$, (Ca, Eu)$_a$Al$_d$O$_e$, (Ca, Eu)$_a$Al$_d$(O, N)$_e$Li$_g$, (Ca, Eu)$_a$Al$_d$(O, N)$_e$, (Ca, Eu)$_a$Al$_d$N$_e$Li$_g$, (Ca, Eu)$_a$Al$_d$N$_e$, (Sr, Eu)$_a$Si$_d$O$_e$Li$_g$, (Sr, Eu)$_a$Si$_d$O$_e$, (Sr, Eu)$_a$Si$_d$(O, N)$_e$Li$_g$, (Sr, Eu)$_a$Si$_d$(O, N)$_e$, (Sr, Eu)$_a$Si$_d$N$_e$Li$_g$, (Sr, Eu)$_a$Si$_d$N$_e$, (Sr, Eu)$_a$(Si, Al)$_d$O$_e$Li$_g$, (Sr, Eu)$_a$(Si, Al)$_d$O$_e$, (Sr, Eu)$_a$(Si, Al)$_d$(O, N)$_e$Li$_g$, (Sr, Eu)$_a$(Si, Al)$_d$(O, N)$_e$, (Sr, Eu)$_a$(Si, Al)$_d$N$_e$Li$_g$, (Sr, Eu)$_a$(Si, Al)$_d$N$_e$, (Sr, Eu)$_a$Al$_d$O$_e$Li$_g$, (Sr, Eu)$_a$Al$_d$O$_e$, (Sr, Eu)$_a$Al$_d$(O, N)$_e$Li$_g$, (Sr, Eu)$_a$Al$_d$(O, N)$_e$, (Sr, Eu)$_a$Al$_d$N$_e$Li$_g$, (Sr, Eu)$_a$Al$_d$N$_e$, (Ba, Eu)$_a$Si$_d$O$_e$Li$_g$, (Ba, Eu)$_a$Si$_d$O$_e$, (Ba, Eu)$_a$Si$_d$(O, N)$_e$Li$_g$, (Ba, Eu)$_a$Si$_d$(O, N)$_e$, (Ba, Eu)$_a$Si$_d$N$_e$Li$_g$, (Ba, Eu)$_a$Si$_d$N$_e$, (Ba, Eu)$_a$(Si, Al)$_d$O$_e$Li$_g$, (Ba, Eu)$_a$(Si, Al)$_d$O$_e$, (Ba, Eu)$_a$(Si, Al)$_d$(O, N)$_e$Li$_g$, (Ba, Eu)$_a$(Si, Al)$_d$(O, N)$_e$, (Ba, Eu)$_a$(Si, Al)$_d$N$_e$Li$_g$, (Ba, Eu)$_a$(Si, Al)$_d$N$_e$, (Ba, Eu)$_a$Al$_d$O$_e$Li$_g$, (Ba, Eu)$_a$Al$_d$O$_e$, (Ba, Eu)$_a$Al$_d$(O, N)$_e$Li$_g$, (Ba, Eu)$_a$Al$_d$(O, N)$_e$, (Ba, Eu)$_a$Al$_d$N$_e$Li$_g$, (Ba, Eu)$_a$Al$_d$N$_e$, (Mg, Ca, Eu)$_a$Si$_d$O$_e$Li$_g$, (Mg, Ca, Eu)$_a$Si$_d$O$_e$, (Mg, Ca, Eu)$_a$Si$_d$(O, N)$_e$Li$_g$, (Mg, Ca, Eu)$_a$Si$_d$(O, N)$_e$, (Mg, Ca, Eu)$_a$Si$_d$N$_e$Li$_g$, (Mg, Ca, Eu)$_a$Si$_d$N$_e$, (Mg, Ca, Eu)$_a$(Si, Al)$_d$O$_e$Li$_g$, (Mg, Ca, Eu)$_a$(Si, Al)$_d$O$_e$, (Mg, Ca, Eu)$_a$(Si, Al)$_d$(O, N)$_e$Li$_g$, (Mg, Ca, Eu)$_a$(Si, Al)$_d$(O, N)$_e$, (Mg, Ca, Eu)$_a$(Si, Al)$_d$N$_e$Li$_g$, (Mg, Ca, Eu)$_a$(Si, Al, Eu)$_d$N$_e$, (Mg, Ca, Eu)$_a$Al$_d$O$_e$Li$_g$, (Mg, Ca, Eu)$_a$Al$_d$O$_e$, (Mg, Ca, Eu)$_a$Al$_d$(O, N)$_e$Li$_g$, (Mg, Ca, Eu)$_a$Al$_d$(O, N)$_e$, (Mg, Ca, Eu)$_a$Al$_d$N$_e$Li$_g$, (Mg, Ca, Eu)$_a$Al$_d$N$_e$, (Mg, Sr, Eu)$_a$Si$_d$O$_e$Li$_g$, (Mg, Sr, Eu)$_a$Si$_d$O$_e$, (Mg, Sr, Eu)$_a$Si$_d$(O, N)$_e$Li$_g$, (Mg, Sr, Eu)$_a$Si$_d$(O, N)$_e$, (Mg, Sr, Eu)$_a$Si$_d$N$_e$Li$_g$, (Mg, Sr, Eu)$_a$Si$_d$N$_e$, (Mg, Sr, Eu)$_a$(Si, Al)$_d$O$_e$Li$_g$, (Mg, Sr, Eu)$_a$(Si, Al)$_d$O$_e$, (Mg, Sr, Eu)$_a$(Si, Al)$_d$(O, N)$_e$Li$_g$, (Mg, Sr, Eu)$_a$(Si, Al)$_d$(O, N)$_e$, (Mg, Sr, Eu)$_a$(Si, Al)$_d$N$_e$Li$_g$, (Mg, Sr, Eu)$_a$(Si, Al, Eu)$_d$N$_e$, (Mg, Sr, Eu)$_a$Al$_d$O$_e$Li$_g$, (Mg, Sr, Eu)$_a$Al$_d$O$_e$, (Mg, Sr, Eu)$_a$Al$_d$(O, N)$_e$Li$_g$, (Mg, Sr, Eu)$_a$Al$_d$(O, N)$_e$, (Mg, Sr, Eu)$_a$Al$_d$N$_e$Li$_g$, (Mg, Sr, Eu)$_a$Al$_d$N$_e$, (Mg, Ba, Eu)$_a$Si$_d$O$_e$Li$_g$, (Mg, Ba, Eu)$_a$Si$_d$O$_e$, (Mg, Ba, Eu)$_a$Si$_d$(O, N)$_e$Li$_g$, (Mg, Ba, Eu)$_a$Si$_d$(O, N)$_e$, (Mg, Ba, Eu)$_a$Si$_d$N$_e$Li$_g$, (Mg, Ba, Eu)$_a$Si$_d$N$_e$, (Mg, Ba, Eu)$_a$(Si, Al)$_d$O$_e$Li$_g$, (Mg, Ba, Eu)$_a$(Si, Al)$_d$O$_e$, (Mg, Ba, Eu)$_a$(Si, Al)$_d$(O, N)$_e$Li$_g$, (Mg, Ba, Eu)$_a$(Si, Al)$_d$(O, N)$_e$, (Mg, Ba, Eu)$_a$(Si, Al)$_d$N$_e$Li$_g$, (Mg, Ba, Eu)$_a$(Si, Al, Eu)$_d$N$_e$, (Mg, Ba, Eu)$_a$Al$_d$O$_e$Li$_g$, (Mg, Ba, Eu)$_a$Al$_d$O$_e$, (Mg, Ba, Eu)$_a$Al$_d$(O, N)$_e$Li$_g$, (Mg, Ba, Eu)$_a$Al$_d$(O, N)$_e$, (Mg, Ba, Eu)$_a$Al$_d$N$_e$Li$_g$, (Mg, Ba, Eu)$_a$Al$_d$N$_e$, (Ca, Sr, Eu)$_a$Si$_d$O$_e$Li$_g$, (Ca, Sr, Eu)$_a$Si$_d$O$_e$, (Ca, Sr, Eu)$_a$Si$_d$(O, N)$_e$Li$_g$, (Ca, Sr, Eu)$_a$Si$_d$(O, N)$_e$, (Ca, Sr, Eu)$_a$Si$_d$N$_e$Li$_g$, (Ca, Sr, Eu)$_a$Si$_d$N$_e$, (Ca, Sr, Eu)$_a$(Si, Al)$_d$O$_e$Li$_g$, (Ca, Sr, Eu)$_a$(Si, Al)$_d$O$_e$, (Ca, Sr, Eu)$_a$(Si, Al)$_d$(O, N)$_e$Li$_g$, (Ca, Sr, Eu)$_a$(Si, Al)$_d$(O, N)$_e$, (Ca, Sr, Eu)$_a$(Si, Al)$_d$N$_e$Li$_g$, (Ca, Sr, Eu)$_a$(Si, Al, Eu)$_d$N$_e$, (Ca, Sr, Eu)$_a$Al$_d$O$_e$Li$_g$, (Ca, Sr, Eu)$_a$Al$_d$O$_e$, (Ca, Sr, Eu)$_a$Al$_d$(O, N)$_e$Li$_g$, (Ca, Sr, Eu)$_a$Al$_d$(O, N)$_e$, (Ca, Sr, Eu)$_a$Al$_d$N$_e$Li$_g$, (Ca, Sr, Eu)$_a$Al$_d$N$_e$, (Ca, Ba, Eu)$_a$Si$_d$O$_e$Li$_g$, (Ca, Ba, Eu)$_a$Si$_d$O$_e$, (Ca, Ba, Eu)$_a$Si$_d$(O, N)$_e$Li$_g$, (Ca, Ba, Eu)$_a$Si$_d$(O, N)$_e$, (Ca, Ba, Eu)$_a$Si$_d$N$_e$Li$_g$, (Ca, Ba, Eu)$_a$Si$_d$N$_e$, (Ca, Ba, Eu)$_a$(Si, Al)$_d$O$_e$Li$_g$, (Ca, Ba, Eu)$_a$(Si, Al)$_d$O$_e$, (Ca, Ba, Eu)$_a$(Si, Al)$_d$(o, N)$_e$Li$_g$, (Ca, Ba, Eu)$_a$(Si, Al)$_a$(O, N)$_e$, (Ca, Ba, Eu)$_a$(Si, Al)$_d$N$_e$Li$_g$, (Ca, Ba, Eu)$_a$(Si, Al, Eu)$_d$N$_e$, (Ca, Ba, Eu)$_a$Al$_d$O$_e$Li$_g$, (Ca, Ba, Eu)$_a$Al$_d$O$_e$, (Ca, Ba, Eu)$_a$Al$_d$(O, N)$_e$Li$_g$, (Ca, Ba, Eu)$_a$Al$_d$(O, N)$_e$, (Ca, Ba, Eu)$_a$Al$_d$N$_e$Li$_g$, (Ca, Ba, Eu)$_a$Al$_d$N$_e$, (Sr, Ba, Eu)$_a$Si$_d$O$_e$Li$_g$, (Sr, Ba, Eu)$_a$Si$_d$O$_e$, (Sr, Ba, Eu)$_a$Si$_d$(O, N)$_e$Li$_g$, (Sr, Ba, Eu)$_a$Si$_d$(O, N)$_e$, (Sr, Ba, Eu)$_a$Si$_d$N$_e$Li$_g$, (Sr, Ba, Eu)$_a$Si$_d$N$_e$, (Sr, Ba, Eu)$_a$(Si, Al)$_d$O$_e$Li$_g$, (Sr, Ba, Eu)$_a$(Si, Al)$_d$O$_e$, (Sr, Ba, Eu)$_a$(Si, Al)$_d$(O, N)$_e$Li$_g$, (Sr, Ba, Eu)$_a$(Si, Al)$_a$(O, N)$_e$, (Sr, Ba, Eu)$_a$(Si, Al)$_d$N$_e$Li$_g$, (Sr, Ba, Eu)$_a$(Si, Al, Eu)$_d$N$_e$, (Sr, Ba, Eu)$_a$Al$_d$O$_e$Li$_g$, (Sr, Ba, Eu)$_a$Al$_d$O$_e$, (Sr, Ba, Eu)$_a$Al$_d$(O, N)$_e$Li$_g$, (Sr, Ba, Eu)$_a$Al$_d$(O, N)$_e$, (Sr, Ba, Eu)$_a$Al$_d$N$_e$Li$_g$, (Sr, Ba, Eu)$_a$Al$_d$N$_e$, (Mg, Ca, Sr, Eu)$_a$Si$_d$O$_e$Li$_g$, (Mg, Ca, Sr, Eu)$_a$Si$_d$O$_e$, (Mg, Ca, Sr, Eu)$_a$Si$_d$(O, N)$_e$Li$_g$, (Mg, Ca, Sr, Eu)$_a$Si$_d$(O, N)$_e$, (Mg, Ca, Sr, Eu)$_a$Si$_d$N$_e$Li$_g$, (Mg, Ca, Sr, Eu)$_a$Si$_d$N$_e$, (Mg, Ca, Sr, Eu)$_a$(Si, Al)$_d$O$_e$Li$_g$, (Mg, Ca, Sr, Eu)$_a$(Si, Al)$_d$O$_e$, (Mg, Ca, Sr, Eu)$_a$(Si, Al)$_d$(O, N)$_e$Li$_g$, (Mg, Ca, Sr, Eu)$_a$(Si, Al)$_d$(O, N)$_e$, (Mg, Ca, Sr, Eu)$_a$(Si, Al)$_d$N$_e$Li$_g$, (Mg, Ca, Sr, Eu)$_a$(Si, Al, Eu)$_d$N$_e$, (Mg, Ca, Sr, Eu)$_a$Al$_d$O$_e$Li$_g$, (Mg, Ca, Sr, Eu)$_a$Al$_d$O$_e$, (Mg, Ca, Sr, Eu)$_a$Al$_d$(O, N)$_e$Li$_g$, (Mg, Ca, Sr, Eu)$_a$Al$_d$(O, N)$_e$, (Mg, Ca, Sr, Eu)$_a$Al$_d$N$_e$Li$_g$, (Mg, Ca, Sr, Eu)$_a$Al$_d$N$_e$, (Mg, Ca, Ba, Eu)$_a$Si$_d$O$_e$Li$_g$, (Mg, Ca, Ba, Eu)$_a$Si$_d$O$_e$, (Mg, Ca, Ba, Eu)$_a$Si$_d$(O, N)$_e$Li$_g$, (Mg, Ca, Ba, Eu)$_a$Si$_d$(O, N)$_e$, (Mg, Ca, Ba, Eu)$_a$Si$_d$N$_e$Li$_g$, (Mg, Ca, Ba, Eu)$_a$Si$_d$N$_e$, (Mg, Ca, Ba, Eu)$_a$(Si, Al)$_d$O$_e$Li$_g$, (Mg, Ca, Ba, Eu)$_a$(Si, Al)$_d$O$_e$, (Mg, Ca, Ba, Eu)$_a$(Si, Al)$_d$(O, N)$_e$Li$_g$, (Mg, Ca, Ba, Eu)$_a$(Si, Al)$_d$(O, N)$_e$, (Mg, Ca, Ba, Eu)$_a$(Si, Al)$_d$N$_e$Li$_g$, (Mg, Ca, Ba, Eu)$_a$(Si, Al, Eu)$_d$N$_e$, (Mg, Ca, Ba, Eu)$_a$Al$_d$O$_e$Li$_g$, (Mg, Ca, Ba, Eu)$_a$Al$_d$O$_e$, (Mg, Ca, Ba, Eu)$_a$Al$_d$(O, N)$_e$Li$_g$, (Mg, Ca, Ba, Eu)$_a$Al$_d$(O, N)$_e$, (Mg, Ca, Ba, Eu)$_a$Al$_d$N$_e$Li$_g$, (Mg, Ca, Ba, Eu)$_a$Al$_d$N$_e$, (Mg, Sr, Ba, Eu)$_a$Si$_d$O$_e$Li$_g$, (Mg, Sr, Ba, Eu)$_a$Si$_d$O$_e$, (Mg, Sr, Ba, Eu)$_a$Si$_d$(O, N)$_e$Li$_g$, (Mg, Sr, Ba, Eu)$_a$Si$_d$(O, N)$_e$, (Mg, Sr, Ba, Eu)$_a$Si$_d$N$_e$Li$_g$, (Mg, Sr, Ba, Eu)$_a$Si$_d$N$_e$, (Mg, Sr, Ba, Eu)$_a$(Si, Al)$_d$O$_e$Li$_g$, (Mg, Sr, Ba, Eu)$_a$(Si, Al)$_d$O$_e$, (Mg, Sr, Ba, Eu)$_a$(Si, Al)$_d$(O, N)$_e$Li$_g$, (Mg, Sr, Ba, Eu)$_a$(Si, Al)$_a$(O, N)$_e$, (Mg, Sr, Ba, Eu)$_a$(Si, Al)$_d$N$_e$Li$_g$, (Mg, Sr, Ba, Eu)$_a$(Si, Al, Eu)$_d$N$_e$, (Mg, Sr, Ba, Eu)$_a$Al$_d$O$_e$Li$_g$, (Mg, Sr, Ba, Eu)$_a$Al$_d$O$_e$, (Mg, Sr, Ba, Eu)$_a$Al$_d$(O, N)$_e$Li$_g$, (Mg, Sr, Ba, Eu)$_a$Al$_d$(O, N)$_e$, (Mg, Sr, Ba, Eu)$_a$Al$_d$N$_e$Li$_g$, (Mg, Sr, Ba, Eu)$_a$Al$_d$N$_e$, (Ca, Sr, Ba, Eu)$_a$Si$_d$O$_e$Li$_g$, (Ca, Sr, Ba, Eu)$_a$Si$_d$O$_e$, (Ca, Sr, Ba, Eu)$_a$Si$_d$(O, N)$_e$Li$_g$, (Ca, Sr, Ba, Eu)$_a$Si$_d$(O, N)$_e$, (Ca, Sr, Ba, Eu)$_a$Si$_d$N$_e$Li$_g$, (Ca, Sr, Ba, Eu)$_a$Si$_d$N$_e$, (Ca, Sr, Ba, Eu)$_a$(Si, Al)$_d$O$_e$Li$_g$, (Ca, Sr, Ba, Eu)$_a$(Si, Al)$_d$O$_e$, (Ca, Sr, Ba, Eu)$_a$(Si, Al)$_d$(O, N)$_e$Li$_g$, (Ca, Sr, Ba, Eu)$_a$(Si, Al)$_d$(O, N)$_e$, (Ca, Sr, Ba, Eu)$_a$(Si, Al)$_d$N$_e$Li$_g$, (Ca, Sr, Ba, Eu)$_a$(Si, Al, Eu)$_d$N$_e$, (Ca, Sr, Ba, Eu)$_a$Al$_d$O$_e$Li$_g$, (Ca, Sr, Ba, Eu)$_a$Al$_d$O$_e$, (Ca, Sr, Ba, Eu)$_a$Al$_d$(O, N)$_e$Li$_g$, (Ca, Sr, Ba, Eu)$_a$Al$_d$(O, N)$_e$, (Ca, Sr, Ba, Eu)$_a$Al$_d$N$_e$Li$_g$, (Ca, Sr, Ba, Eu)$_a$Al$_d$N$_e$, (Mg, Ca, Sr, Ba, Eu)$_a$Si$_d$O$_e$Li$_g$, (Mg, Ca, Sr, Ba, Eu)$_a$Si$_d$O$_e$, (Mg, Ca, Sr, Ba, Eu)$_a$Si$_d$(O, N)$_e$Li$_g$, (Mg, Ca, Sr, Ba, Eu)$_a$Si$_d$(O, N)$_e$, (Mg, Ca, Sr, Ba, Eu)$_a$Si$_d$N$_e$Li$_g$, (Mg, Ca, Sr, Ba, Eu)$_a$Si$_d$N$_e$, (Mg, Ca, Sr, Ba, Eu)$_a$(Si, Al)$_d$O$_e$Li$_g$, (Mg, Ca, Sr, Ba, Eu)$_a$(Si, Al)$_d$O$_e$, (Mg, Ca, Sr, Ba, Eu)$_a$(Si, Al)$_d$(O, N)$_e$Li$_g$, (Mg, Ca, Sr, Ba, Eu)$_a$(Si, Al)$_a$(O, N)$_e$, (Mg, Ca, Sr, Ba, Eu)$_a$(Si, Al)$_d$N$_e$Li$_g$, (Mg, Ca, Sr, Ba, Eu)$_a$(Si, Al, Eu)$_d$N$_e$, (Mg, Ca, Sr, Ba, Eu)$_a$Al$_d$O$_e$Li$_g$, (Mg, Ca, Sr, Ba, Eu)$_a$Al$_d$O$_e$, (Mg, Ca, Sr, Ba, Eu)$_a$Al$_d$(O, N)$_e$Li$_g$, (Mg, Ca, Sr, Ba, Eu)$_a$Al$_d$(O, N)$_e$, (Mg, Ca, Sr, Ba, Eu)$_a$Al$_d$N$_e$Li$_g$, (Mg, Ca, Sr, Ba, Eu)$_a$Al$_d$N$_e$, (Mg, Ca, Sr, Ba, Eu)$_a$Si$_d$O$_e$Li$_g$, (Mg, Ca, Sr, Ba, Eu)$_a$Si$_d$O$_e$, (Mg, Ca, Sr, Ba, Eu)$_a$Si$_d$(O, N)$_e$Li$_g$, (Mg, Ca, Sr, Ba, Eu)$_a$Si$_d$(O, N)$_e$, (Mg, Ca, Sr, Ba, Eu)$_a$Si$_d$N$_e$Li$_g$, (Mg, Ca, Sr, Ba, Eu)$_a$Si$_d$N$_e$, (Mg, Ca, Sr, Ba, Eu)$_a$(Si, Al)$_d$O$_e$Li$_g$, (Mg, Ca, Sr, Ba, Eu)$_a$(Si, Al)$_d$O$_e$, (Mg, Ca, Sr, Ba, Eu)$_a$(Si, Al)$_a$(O,N)$_e$Li$_g$, (Mg, Ca, Sr, Ba, Eu)$_a$(Si, Al)$_d$(O, N)$_e$, (Mg, Ca, Sr, Ba, Eu)$_a$(Si, Al)$_d$N$_e$Li$_g$, (Mg, Ca, Sr, Eu)$_a$(Si, Al, Eu)$_d$N$_e$, (Mg, Ca, Sr, Eu)$_a$Al$_d$O$_e$Li$_g$, (Mg, Ca, Sr, Ba, Eu)$_a$Al$_d$O$_e$, (Mg, Ca, Sr, Ba, Eu)$_a$Al$_d$(O, N)$_e$Li$_g$, (Mg, Ca, Sr, Ba, Eu)$_a$Al$_d$(O, N)$_e$, (Mg, Ca, Sr, Ba, Eu)$_a$Al$_d$N$_e$Li$_g$, and (Mg, Ca, Sr, Ba, Eu)$_a$Al$_d$N$_e$.

And as shown in Experiments 105-113 (Table 6), together with Eu or substituting Eu, what includes Mn, Ce, Nd, Tb, Dy, Ho, Er, Tm, sm, and/or Yb may be included in the embodiment of the present invention.

<<Light Emitting Device>>

Example 114

Figure 5:
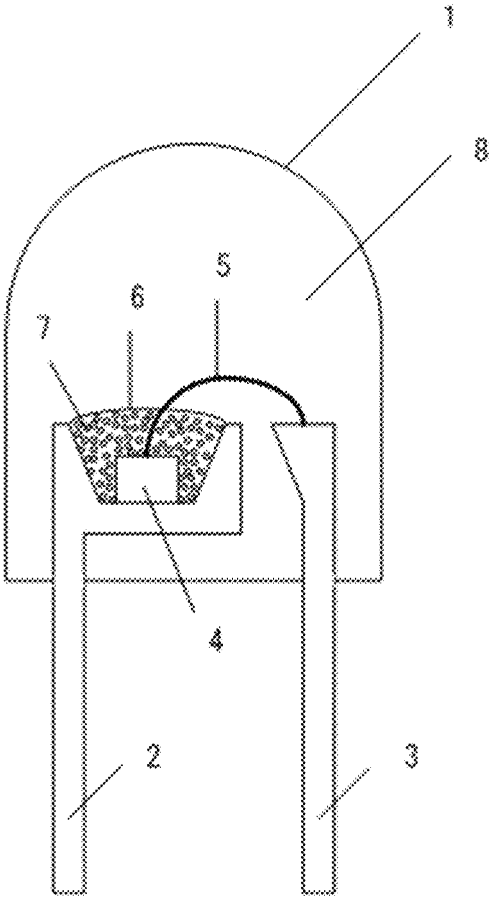
FIG. 5 shows a schematic diagram illustrating an illuminating device (bullet-type LED illuminating device) according to the present invention.

FIG. 5 shows a schematic diagram illustrating an illuminating device (bullet-type of LED illuminating device) according to the present invention.

A bullet-type of white color light-emitting diode lamp (1) was made as shown in FIG. 5. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the blue light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the Example 114, a phosphor powder in which the phosphor made in Experiment 1, a blue phosphor of JEM:Ce; β-sialon:Eu; and $CaAlSiN_3$:Eu were mixed at the weight ratios of 4:4:1:1 was mixed with epoxy resin at the concentration of 35 wt % and an appropriate amount of thus-mixed mixture was dropped with a dispenser to form the first resin (6) in which the phosphor (7) was mixed. The color of the thus-obtained light-emitting device was a white color including emission components from a blue color to infrared.

Example 115

Figure 6:
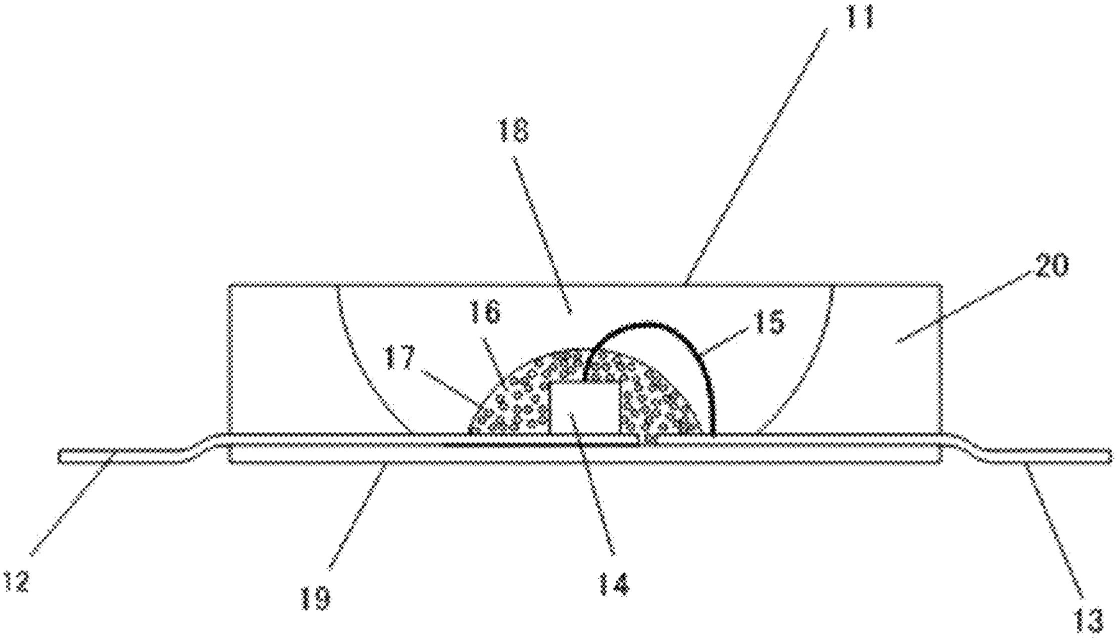
FIG. 6 shows a schematic diagram illustrating an illuminating device (board-mounting-type LED illuminating device) according to the present invention.

FIG. 6 shows a schematic diagram illustrating an illuminating device (board-mounting-type LED illuminating device) according to the present invention.

A board-mounting chip-type of light-emitting diode lamp (11) was made as shown in FIG. 6. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which a blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

A mixture of the first resin (16) and a mixture phosphor (17) in which a phosphor made in Experiment 1 and a red phosphor of $CaAlSiN_3$:Eu were mixed by the mass ratio of 1:1 was mounted in the vicinity of the light-emitting diode element. The first resin in which this phosphor is dispersed is transparent, and covers the entire blue color light-emitting diode element (14). Also, a wall surface member (20) having a hole opened at the center portion is fixed to the ceramic board. The wall surface member (20) has the center portion formed as the hole in which the blue light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In this example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In this example, the same epoxy resin was used for both the first resin (16) and second resin (18). A red and infrared light-emitting LED was obtained.

INDUSTRIAL APPLICABILITY

A nitride-oxynitride phosphor of the present invention has different emission characteristics (an emission color and excitation characteristics, and an emission spectrum) from those of the conventional phosphor and, in the case where it is combined with an LED excitation source, the emission intensity is high and it is chemically and thermally stable, and further deterioration of the brightness of the phosphor is little even if it is exposed to the excitation source such that it is a nitride phosphor to be used suitably for the white color LED or the like. It is expected that the phosphor will be utilized in material design for various kinds of display devices so as to contribute to the development of the industry.

EXPLANATION OF NUMERALS

1 bullet-type white emission diode lamp
2, 3 lead wire
4 ultraviolet light-emitting diode element
5 gold thin wire
6, 8 resin
7 phosphor
11 board-mounting chip-type of infrared light-emitting diode lamp
12, 13 lead wire
14 blue light-emitting diode element
15 gold thin wire
16, 18 resin
17 phosphor
19 alumina ceramic board
20 wall surface member

What is claimed is:

1. A phosphor comprising an inorganic compound represented by (A, M)$_a$D$_d$E$_e$Li$_g$ that includes at least an A element, an M element, a D element, an E element (here, A is at least one kind of elements selected from a group consisting of Mg, Ca, Sr, and Ba; M is at least one kind of elements selected from a group consisting of Mn, Eu, Ce, Nd, Tb, Dy, Ho, Er, Tm, and Yb; D is one or two kinds of elements selected from a group consisting of Si and Al; and E is one or two kinds of elements selected from a group consisting of O and N); and, if necessary, a Li wherein atomic fraction parameters: a, d, e, and g satisfy:

$$2.4 \leq a \leq 4.8,$$

$$17.4 \leq d \leq 22.2,$$

$$26.2 \leq e \leq 28.6, \text{ and}$$

$$0 \leq g \leq 3,$$

wherein the phosphor emits light having an emission peak at a wavelength in a range of 600 nm or longer and 850 nm or shorter upon irradiation of light having a wavelength that is 300 nm or longer and 600 nm or shorter.

2. The phosphor according to claim 1 wherein a parameter of g is a numeral value in a range of: $0.21 \leq g \leq 1.05$.

3. The phosphor according to claim 1 wherein the inorganic compound is represented by a composition of $(A,M)_{6x}D_{27-12x}E_{31-6x}Li_{3y}$ (here, x and y satisfy: $0.4 \leq x \leq 0.8$ and $0 \leq y \leq 0.35$, respectively).

4. The phosphor according to claim 3 wherein the x satisfies: $0.45 \leq x \leq 0.55$.

5. The phosphor according to claim 1 wherein the inorganic compound comprises a crystal represented by $(A,M)_{6x}D_{27-12x}E_{31-6x}Li_{3y}$ (here, $0.4 \leq x \leq 0.8$ and $0 \leq y \leq 0.35$) (hereinafter, referred to as a present crystal) or a crystal having an identical crystal structure thereof (hereinafter, referred to as a present identical crystal).

6. The phosphor according to claim 5 wherein the inorganic compound is represented by $(Sr,Eu)_3(Si,Al)_{21}(O,N)_{28}Li_{0.96}$.

7. The phosphor according to claim 5 wherein the inorganic compound comprises a crystal having an identical crystal structure of $Sr_3Si_{12.432}Al_{8.568}O_{1.608}N_{26.392}Li_{0.96}$.

8. The phosphor according to claim 5 wherein the present crystal and the present identical crystal is in a hexagonal crystal system and lattice constants: a, b, and c satisfy:

$$1.6 < a < 1.8 \text{ nm},$$

$$b = a, \text{ and}$$

$$0.44 < c < 0.52 \text{ nm}.$$

9. The phosphor according to claim 5 wherein the present crystal and the present identical crystal comprises a crystal or crystals that belong to a space group of $P6_3$.

10. The phosphor according to claim 1 wherein the inorganic compound comprises a crystal represented by $Sr_{6x}(Si,Al)_{27-12x}(O,N)_{31-6x}Li_{3y}$ (here, $0.4 \leq x \leq 0.8$ and $0 \leq y \leq 0.35$) or a crystal having an identical crystal structure thereof and including an M element.

11. The phosphor according to claim 1 wherein the A element comprises Sr, and the M element comprises Eu.

12. The phosphor according to claim 1 wherein the D element includes Si and Al and $0.4 \leq Al/(Al+Si) \leq 0.6$ is satisfied.

13. The phosphor according to claim 1 wherein the E element includes O and N and $0.01 \leq O/(O+N) \leq 0.1$ is satisfied.

14. A method of manufacturing a phosphor as recited in claim 1, the method comprising the steps of: blending one or more raw materials selected from a group consisting of nitride, oxynitride, oxide, carbonate, and fluoride, each of which comprises an A element (here, A is at least one kind of element selected from a group consisting of Mg, Ca, Sr, and Ba), an M element (here, M is at least one kind of element selected from a group consisting of Mn, Eu, Ce, Nd, Tb, Dy, Ho, Er, Tm, and Yb), a D element (here, D is one or two kinds of elements selected from a group consisting of Si and Al) and, if necessary, Li; and firing the one or more raw materials at a temperature that is 1400 °C or higher and is 2200 °C or lower.

15. A light emitting element comprising: an excitation source that emits light having a wavelength in a range that is 300 nm or longer and 600 nm or shorter and a phosphor as recited in claim 1.

16. The light emitting element according to claim 15 wherein the excitation source comprises a light-emitting diode (LED) or a laser diode (LD).

17. The light emitting element according to claim 15 further comprising: at least another phosphor which emits fluorescence light having a maximum value of an emission peak in a wavelength range that is 400 nm or longer and 760 nm or shorter upon irradiation of light having a wavelength that is 300 nm or longer and 600 nm or shorter.

18. The light emitting element according to claim 15 further comprising: one or more kinds of phosphors selected from a group consisting of: AlN:(Eu, Si), $BaMgAl_{10}O_{17}$: Eu, $SrSi_9Al_{19}ON_{31}$: Eu, $LaSi_9Al_{19}N_{32}$: Eu, α-sialon: Ce, JEM: Ce, β-sialon: Eu, $(Ba, Sr, Ca, Mg)_2SiO_4$: Eu, $(Ca, Sr, Ba)Si_2O_2N_2$: Eu, YAG: Ce, α-sialon: Eu, $CaAlSiN_3$:Ce, $LasSi_6N_{11}$:Ce, $CaAlSiN_3$:Eu, $(Ca, Sr)AlSiN_3$:Eu, $Ca_2Si_8N_8$: Eu, and $Sr_2Si_5N_8$:Eu.

19. A light emitting device comprising a light emitting element as recited in claim 15, wherein the light emitting device is selected from the group consisting of an illuminating device, a backlight for a liquid crystal panel, a lamp for a projector, an infrared lighting device, and a light source for an infrared measuring device.

* * * * *